(12) United States Patent
Masumura et al.

(10) Patent No.: US 12,469,835 B2
(45) Date of Patent: Nov. 11, 2025

(54) SEMICONDUCTOR DEVICE

(71) Applicant: RENESAS ELECTRONICS CORPORATION, Tokyo (JP)

(72) Inventors: Yoshihiro Masumura, Tokyo (JP); Takamichi Hosokawa, Tokyo (JP); Keita Takada, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 306 days.

(21) Appl. No.: 18/303,902

(22) Filed: Apr. 20, 2023

(65) Prior Publication Data

US 2023/0402443 A1 Dec. 14, 2023

(30) Foreign Application Priority Data

Jun. 13, 2022 (JP) ................................. 2022-094814

(51) Int. Cl.
*H01L 25/18* (2023.01)
*H01L 23/00* (2006.01)
(Continued)

(52) U.S. Cl.
CPC ........ *H01L 25/18* (2013.01); *H01L 23/49575* (2013.01); *H01L 24/05* (2013.01);
(Continued)

(58) Field of Classification Search
None
See application file for complete search history.

(56) References Cited

U.S. PATENT DOCUMENTS

| 9,711,451 B2 | 7/2017 | Igarashi et al. |
| 2010/0019391 A1* | 1/2010 | Strzalkowski ........ H01L 23/495 257/777 |

(Continued)

FOREIGN PATENT DOCUMENTS

| JP | 2019-009158 A | 1/2019 |
| JP | 2019-009353 A | 1/2019 |

(Continued)

OTHER PUBLICATIONS

Office Action issued on Aug. 19, 2025 in the corresponding Japanese patent application No. 2022-094814, w/ English Translation.

*Primary Examiner* — Michelle Mandala
(74) *Attorney, Agent, or Firm* — Rimon P.C.

(57) ABSTRACT

A semiconductor device includes: a first chip mounting portion; a second chip mounting portion; a first semiconductor chip mounted on the first chip mounting portion; second and third semiconductor chips mounted on the second chip mounting portion; and a sealing body for sealing them. Here, the third semiconductor chip includes a first coil and a second coil that are magnetically coupled to each other. Also, the first coil is electrically connected with a first circuit formed in the first semiconductor chip, and the second coil is electrically connected with a second circuit formed in the second semiconductor chip. Also, in cross-sectional view, the second coil is located closer to the second chip mounting portion than the first coil. Further, a power consumption during an operation of the second semiconductor chip is greater than a power consumption during an operation of the first semiconductor chip.

18 Claims, 21 Drawing Sheets

(51) Int. Cl.
  *H01L 23/495* (2006.01)
  *H01L 25/00* (2006.01)
  *H01L 23/31* (2006.01)
  *H02M 1/08* (2006.01)
  *H02M 7/00* (2006.01)
  *H10D 86/85* (2025.01)

(52) U.S. Cl.
  CPC .............. *H01L 24/06* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 25/50* (2013.01); *H01L 23/3107* (2013.01); *H01L 23/49513* (2013.01); *H01L 24/92* (2013.01); *H01L 2224/05567* (2013.01); *H01L 2224/0613* (2013.01); *H01L 2224/06155* (2013.01); *H01L 2224/29139* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48101* (2013.01); *H01L 2224/48108* (2013.01); *H01L 2224/48137* (2013.01); *H01L 2224/48257* (2013.01); *H01L 2224/49109* (2013.01); *H01L 2224/49175* (2013.01); *H01L 2224/73265* (2013.01); *H01L 2224/92247* (2013.01); *H02M 1/08* (2013.01); *H02M 7/003* (2013.01); *H10D 86/85* (2025.01)

(56) References Cited

U.S. PATENT DOCUMENTS

| | | | |
|---|---|---|---|
| 2018/0277518 A1* | 9/2018 | Iida | H01L 24/32 |
| 2018/0366409 A1 | 12/2018 | Kuwabara et al. | |
| 2019/0333866 A1 | 10/2019 | Tsukuda | |
| 2022/0077081 A1* | 3/2022 | Kurita | H01L 23/645 |
| 2022/0223332 A1* | 7/2022 | Imasaka | H01L 23/5227 |

FOREIGN PATENT DOCUMENTS

| | | |
|---|---|---|
| JP | 2019-192847 A | 10/2019 |
| WO | 2015/114758 A1 | 8/2015 |

* cited by examiner

SEMICONDUCTOR DEVICE

CROSS-REFERENCE TO RELATED APPLICATIONS

The disclosure of Japanese Patent Application No. 2022-094814 filed on Jun. 13, 2022, including the specification, drawings and abstract is incorporated herein by reference in its entirety.

BACKGROUND

The present disclosure relates to a semiconductor device, and can be suitably used, for example, for a semiconductor device including a plurality of semiconductor chips.

A semiconductor device in a form of a semiconductor package can be manufactured by mounting a semiconductor chip on a die pad, electrically connecting a pad electrode of the semiconductor chip with a lead via a wire, and resin sealing them.

Here, there are disclosed techniques listed below.
[Patent Document 1] PCT International Publication No. 2015-114758

Patent Document 1 discloses a technique in which two coils in a semiconductor chip are inductively coupled, thereby transmitting an electric signal.

SUMMARY

It is desirable to improve a reliability of a semiconductor device including three semiconductor chips and that utilizes coils, which are magnetically coupled to each other, formed in another semiconductor chip in order to transmit a signal between two of the three semiconductor chips.

Other objects and novel features will become apparent from the description of this specification and the accompanying drawings.

A semiconductor device according to one embodiment, includes: a first chip mounting portion; a second chip mounting portion; a first semiconductor chip mounted on the first chip mounting portion; a second semiconductor chip mounted on the second chip mounting portion; a third semiconductor chip mounted on the second chip mounting portion; and a sealing body for sealing them. Here, the third semiconductor chip includes a first coil and a second coil that are magnetically coupled to each other. Also, the first coil is electrically connected with a first circuit formed in the first semiconductor chip, and the second coil is electrically connected with a second circuit formed in the second semiconductor chip. Also, in cross-sectional view, the second coil is located closer to the second chip mounting portion than the first coil. Also, a power consumption during an operation of the second semiconductor chip is greater than a power consumption during an operation of the first semiconductor chip. Further, an area of the second chip mounting portion is larger than an area of the first chip mounting portion.

According to the one embodiment, the reliability of the semiconductor device can be improved.

DETAILED DESCRIPTION

Figure 1:
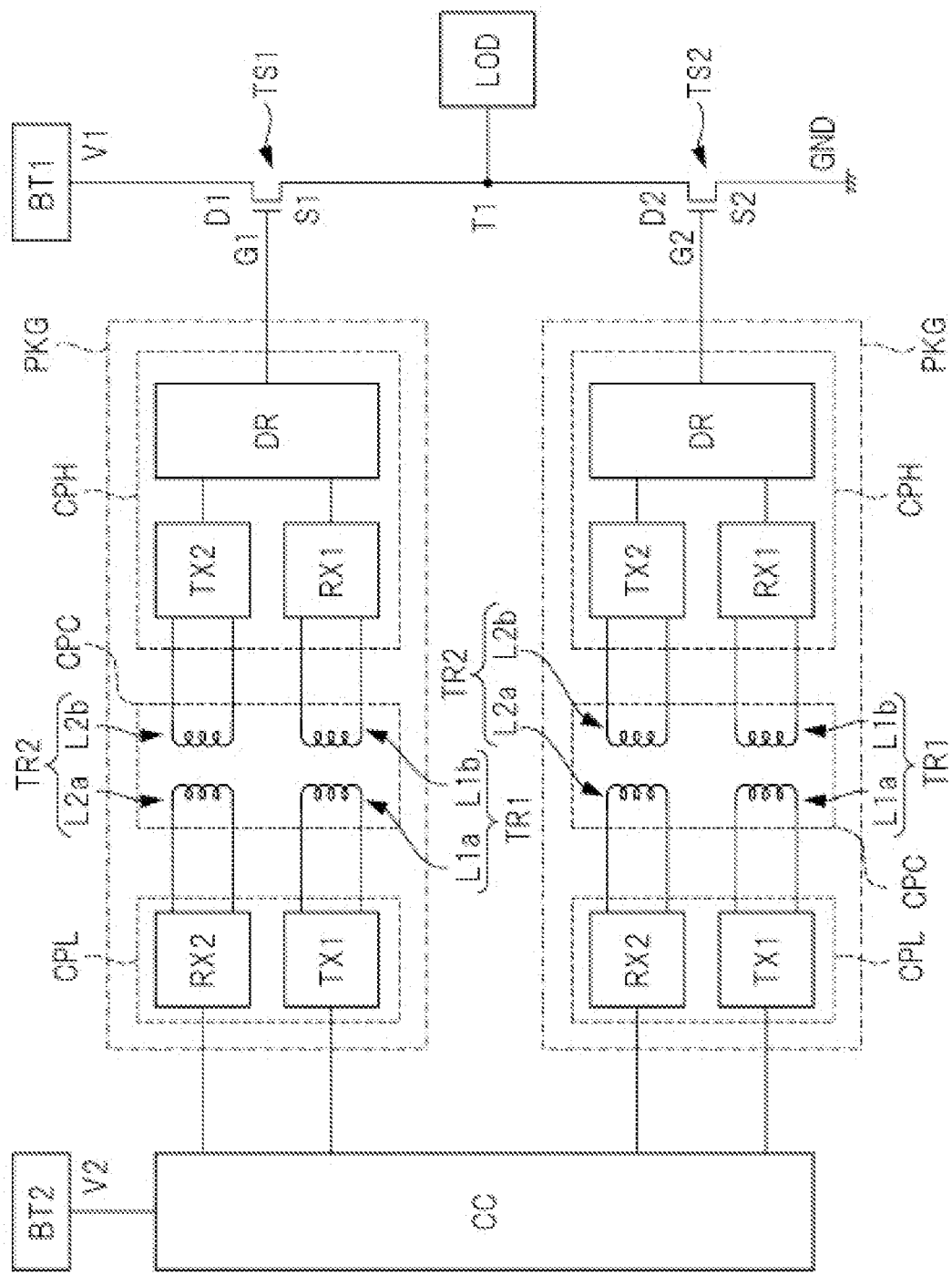
FIG. 1 is a circuit diagram showing an inverter circuit using a semiconductor device according to one embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The details of the embodiments will be explained based on drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

Embodiment

<Circuit Configuration>

FIG. 1 is a circuit diagram showing an inverter circuit using a semiconductor device PKG according to the present embodiment. Note that, in FIG. 1, a portion surrounded by a dotted line with reference numeral CPH is formed in the semiconductor chip CPH, a portion surrounded by a dotted line with reference numeral CPL is formed in the semiconductor chip CPL, a portion surrounded by a dotted line with reference numeral CPC is formed in the semiconductor chip CPC, and a portion surrounded by a dashed-dotted line with reference numeral PKG is formed in the semiconductor device PKG. In the inverter-circuit shown in FIG. 1, two semiconductor devices PKG are used.

The semiconductor device PKG used in the inverter-circuit shown in FIG. 1 includes a semiconductor chip CPC,CPL,CPH. A transmission circuit TX1 and a reception circuit RX2 are formed in the semiconductor chip CPL, and a reception circuit RX1, a transmission circuit TX2, and a drive circuit (control circuit) DR are formed in the semiconductor chip CPH. In the semiconductor chip CPC, a transformer TR1 made of coil L1a,L1b magnetically coupled to each other and a transformer TR2 made of coil L2a,L2b magnetically coupled to each other are formed. The inverter circuit shown in FIG. 1 also has a control circuit CC, and the control circuit CC is formed in another semiconductor chip provided outside the semiconductor package PKG.

The transmitting circuit TX1 and the receiving circuit RX1 are circuits for transmitting signals from the control circuit CC to the driving circuit DR. The transmission circuit TX1 converts the signal sent from the control circuit CC to the transmission circuit TX1, and transmits the converted signal to the reception circuit RX1 via the transformer TR1. The reception circuit RX1 converts the signal received from the transmission circuit TX1 via the transformer TR1 and transmits the converted signal to the drive circuit DR. The transmitting circuit TX2 and the receiving circuit RX2 are circuits for transmitting signals from the driving circuit DR to the control circuit CC. The transmission circuit TX2 converts the signal sent from the drive circuit DR to the transmission circuit TX2, and transmits the converted signal to the reception circuit RX2 via the transformer TR2. The reception circuit RX2 converts the signal received from the transmission circuit TX2 via the transformer TR2 and transmits the converted signal to the control circuit CC.

The inverter circuit shown in FIG. 1 includes a power transistor TS1,TS2. The power transistor TS1 is a transistor for a high-side switch (high-potential-side switch), and the power transistor TS2 is a transistor for a low-side switch (low-potential-side switch). Each of the power transistor TS1 and the power transistor TS2 is formed in a separate semiconductor chip provided outside the semiconductor package PKG.

Hereinafter, the power transistor TS1,TS2 is the power MOSFET (Metal Oxide Semiconductor Field Effect Transistor). As the power transistor TS1,TS2, a IGBT (Insulated Gate Bipolar Transistor) may be applied, and in the following explanation regarding the power transistor TS1,TS2, the "source" may be read as an "emitter", and the "drain" may be read as a "collector".

In the present application, a MOSFET includes not only a MISFET (Metal Insulator Semiconductor Field Effect Transistor: MIS field-effect transistor) including an oxide film (silicon-oxide film) as a gate insulating film but also a MISFET including an insulating film other than the oxide film as a gate insulating film.

The power transistor TS1 and the power transistor TS2 are connected in series, and a source (S1) of the power transistor TS1 is connected to a drain (D2) of the power transistor TS2. A power supply potential (power supply voltage) V1 is to be supplied from a power supply (battery) BT1 to the drain (D1) of the power transistor TS1. Also, a power supply potential (power supply voltage) V2 is to be supplied from a power supply (battery) BT2 to the control circuitry CC. The power supply potential V1 to be supplied to the drain (D1) of the power transistors TS1 is considerably higher than the power supply potential V2 (for example, several V to several tens V) to be supplied to the control circuitry CC, and is, for example, 100V or more (several hundred V). A reference potential lower than the power supply potential V1, for example, a ground potential (GND) is to be supplied to the source (S2) of the power transistor TS2. Each of the gate (G1) of the power transistor TS1 and the gate (G2) of the power transistor TS2 is connected to the driver DR.

In the present embodiment, the same number of the semiconductor device PKG as the number of power transistors TS1,TS2 is used. Here, the drive circuit DR of the semiconductor device PKG provided for the power transistor TS1 controls the voltage of the gate (G1) of the power transistor TS1, and the voltage of the gate (G2) of the power transistor TS2 is controlled by the drive circuit DR of the semiconductor device PKG provided for the power transistor TS2. Alternatively, one semiconductor device PKG may be used for two power transistors TS1,TS2, but in this case, the driver DR of the common semiconductor device PKG controls the voltage of each gate (G1,G2) of the two power transistors TS1,TS2.

The operation of each power transistor TR1,TR2 can be controlled by controlling the gate voltage to be supplied from the drive voltage DR to each gate (G1,G2) of each power transistor TS1,TS2 in accordance with the signal (control signal) supplied from the control circuit CC to the drive circuit via the transmit circuit TX1, the transformer TR1, and the receive circuit RX1.

A terminal T1 provided between the source (S1) of the power transistor TS1 and the drain (D2) of the power transistor TS2 is a terminal for outputting the inverter. The terminal T1 is connected to the loading LOD. The loading LOD is, for example, a coil of a motor. The DC power supplied to the inverter circuit is converted into AC power by the inverter circuit and supplied to the load LD.

A transformer TR1 is interposed between the transmission circuit TX1 and the reception circuit RX1, and a transformer TR2 is interposed between the transmission circuit TX2 and the reception circuit RX2. The control circuit CC may transmit a signal (control signal) to the drive circuit DR through the transmitting circuit TX1, the transformer TR1, and the receiving circuit RX1. The driving circuit DR may transmit a signal to the control circuit CC through the transmitting circuit TX2, the transformer TR2, and the receiving circuit RX2. Each of the coiled L1a,L1b,L2a,L2b can also be regarded as an inductor.

The transformer TR1 is formed by a coil L1a,L1b formed in the semiconductor chip CPC, but the coil L1a and the coil L1b are not connected by conductors but are magnetically coupled to each other. Therefore, when a current flows in the coil L1a, an induced electromotive force is generated in the coil L1b in accordance with a change in the current, and an induced current flows. The coil L1a is a primary coil, and the coil L1b is a secondary coil. Using this, a signal corresponding to the signal transmitted by the transmission circuit TX1 can be received by the reception circuit TR1 by transmitting a signal from the transmission circuit TX1 to the coil L1a (primary coil) of the transformer TR1 to flow a current, and detection (receiving) an induced current (or induced electromotive force) generated in the coil L1b (secondary coil) of the transformer in response to the signal transmitted by the reception circuit RX1.

Further, the transformer TR2 is formed by a coil L2a,L2b formed in the semiconductor chip CPC, but the coil L2b and the coil L2a are not connected by conductors but are magnetically coupled to each other. Therefore, when a current flows in the coil L2b, an induced electromotive force is generated in the coil L2a in accordance with a change in the current, and an induced current flows. The coil L2b is a primary coil, and the coil L2a is a secondary coil. Using this, a signal corresponding to the signal transmitted by the transmission circuit TX2 can be received by the reception circuit TR2 by transmitting a signal from the transmission circuit TX2 to the coil L2b (primary coil) of the transformer TR2 to flow a current, and detection (receiving) an induced current (or induced electromotive force) generated in the coil L2a (secondary coil) of the transformer in response to the signal transmitted by the reception circuit RX2.

A path from the transmission circuit TX1 to the reception circuit RX1 through the transformer TR1 and a path from the transmission circuit TX2 to the reception circuit RX2 through the transformer TR2 can transmit signals between the semiconductor chip CPL and the semiconductor chip CPH.

The semiconductor chip CPL and the semiconductor chip CPH are different from each other. For example, the semiconductor chip CPL is electrically connected to a low-voltage area having a circuit (for example, a control circuit CC) that is operated or driven at a low voltage (for example, several V to several tens V) via a wire BW and a lead LD (specifically, a lead LD2) which will be described later. Further, the semiconductor chip CPH is electrically connected to a high-voltage area having a circuit (for example, a power transistor TS1,TS2) that is operated or driven at a higher voltage (for example, a 100V or higher) than the low voltage via a wire BW and a lead LD (specifically, a lead LD1) to be described later. However, since the transmission of the signal between the semiconductor chip CPL,CPH is through the transformer TR1,TR2, the signal can be transmitted between different-voltage circuits.

In FIG. 1, the control circuit CC is incorporated in a semiconductor chip other than the semiconductor chip CPC, CPH,CPL, but as another embodiment, the control circuit CC may be incorporated in the semiconductor chip CPL.

<Structure of Semiconductor Device>

Figure 2:
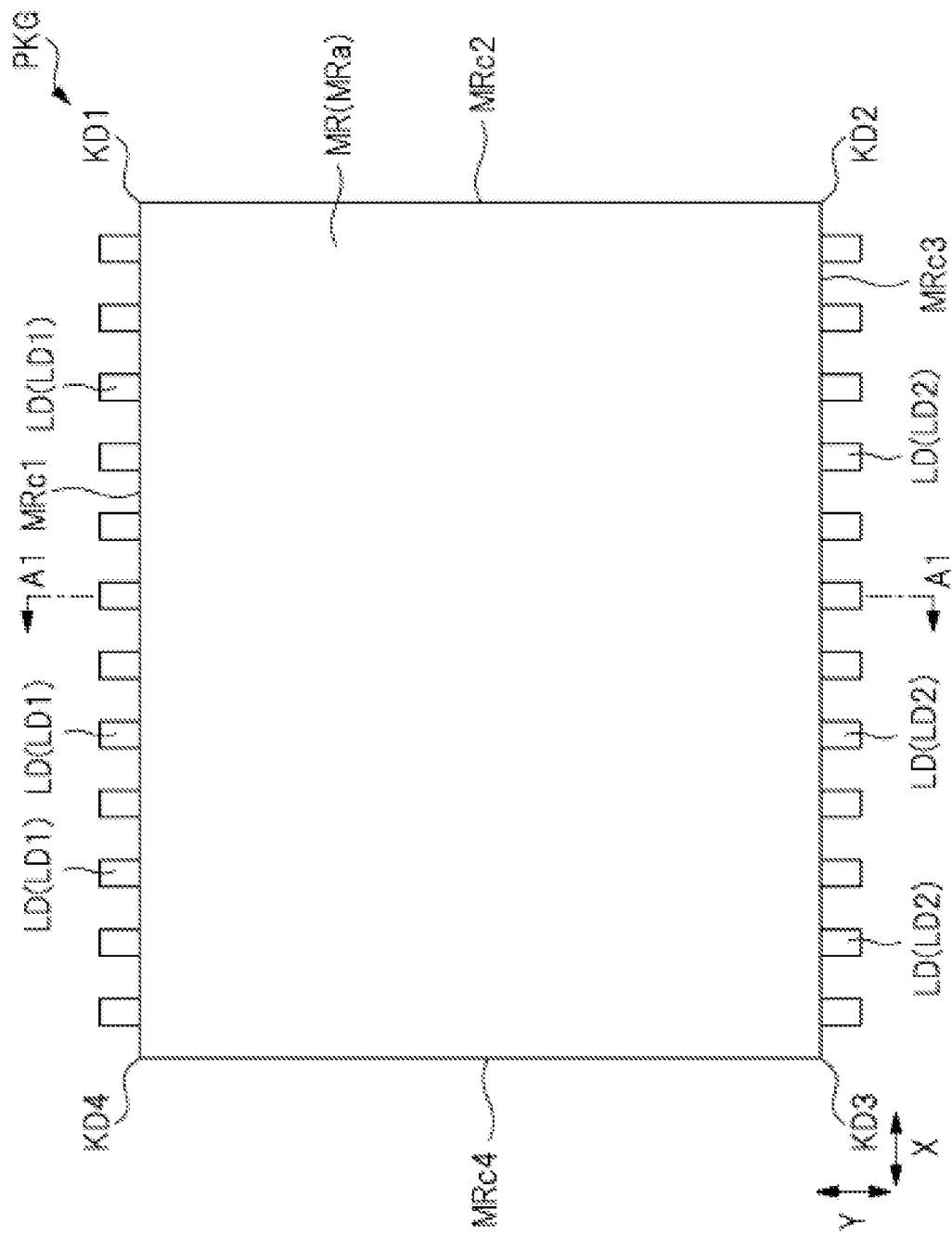
FIG. 2 is an upper surface view of the semiconductor device according to the one embodiment.
Figure 3:
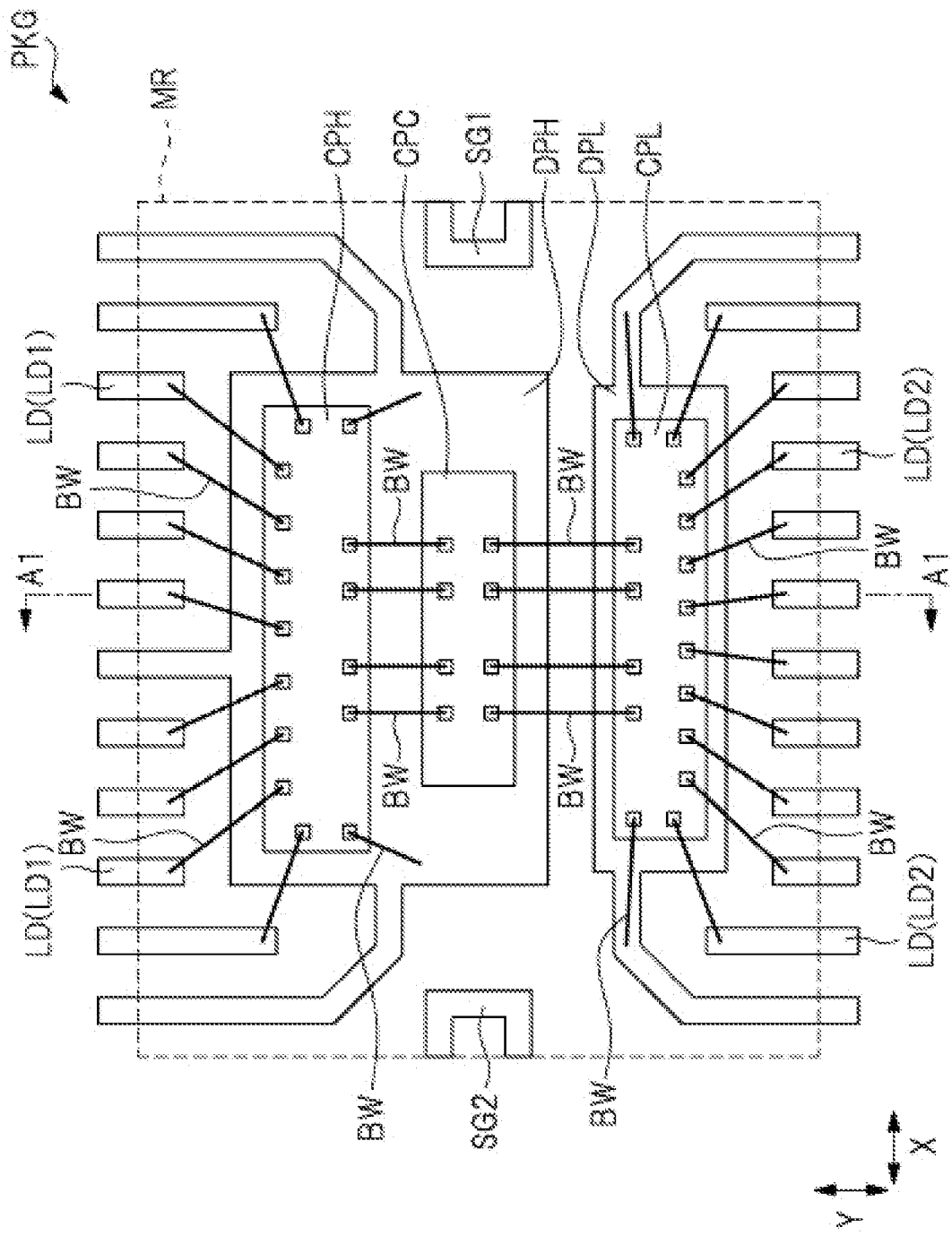
FIG. 3 is a perspective plan view of the semiconductor device according to the one embodiment.
Figure 4:
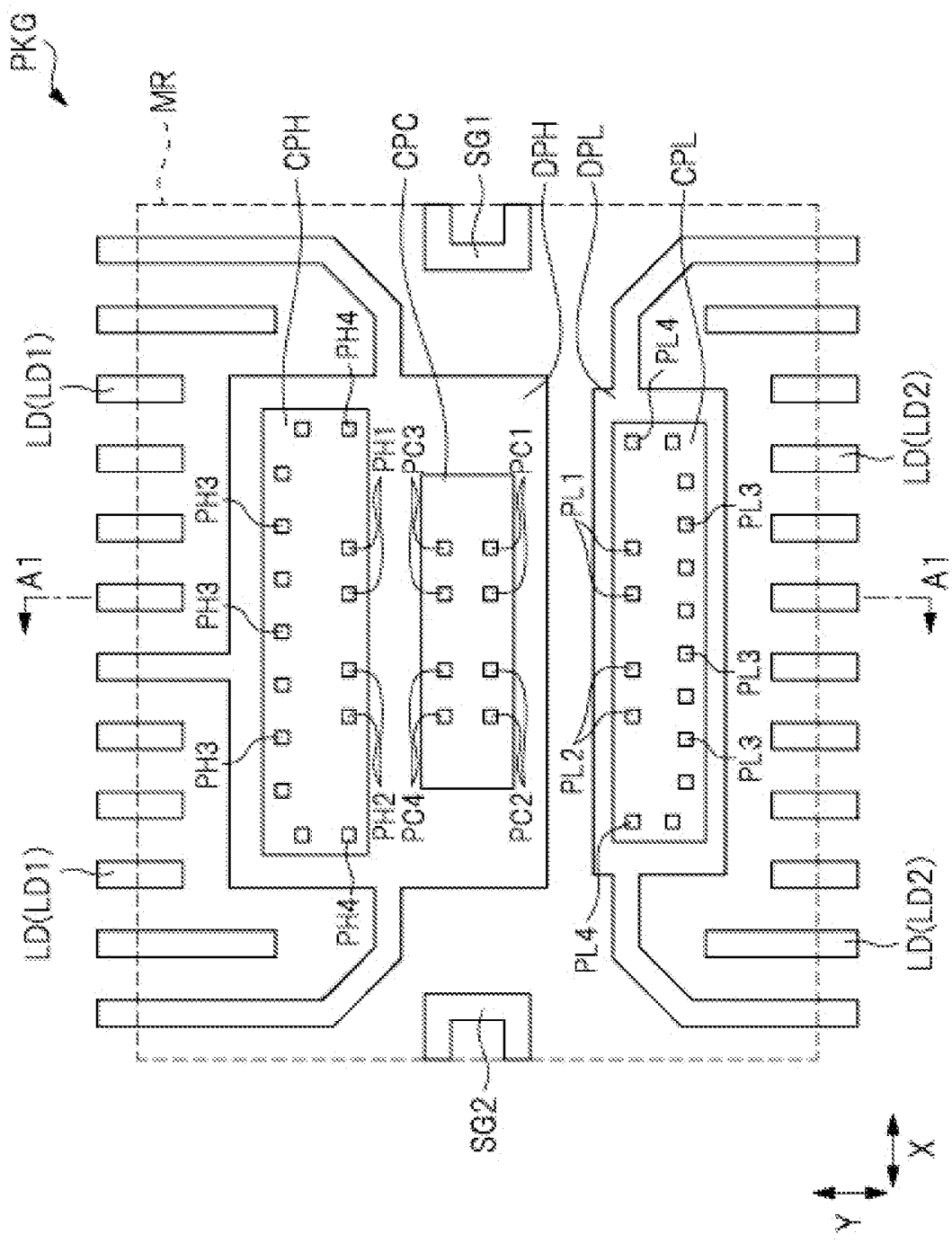
FIG. 4 is a perspective plan view of the semiconductor device according to the one embodiment.
Figure 5:
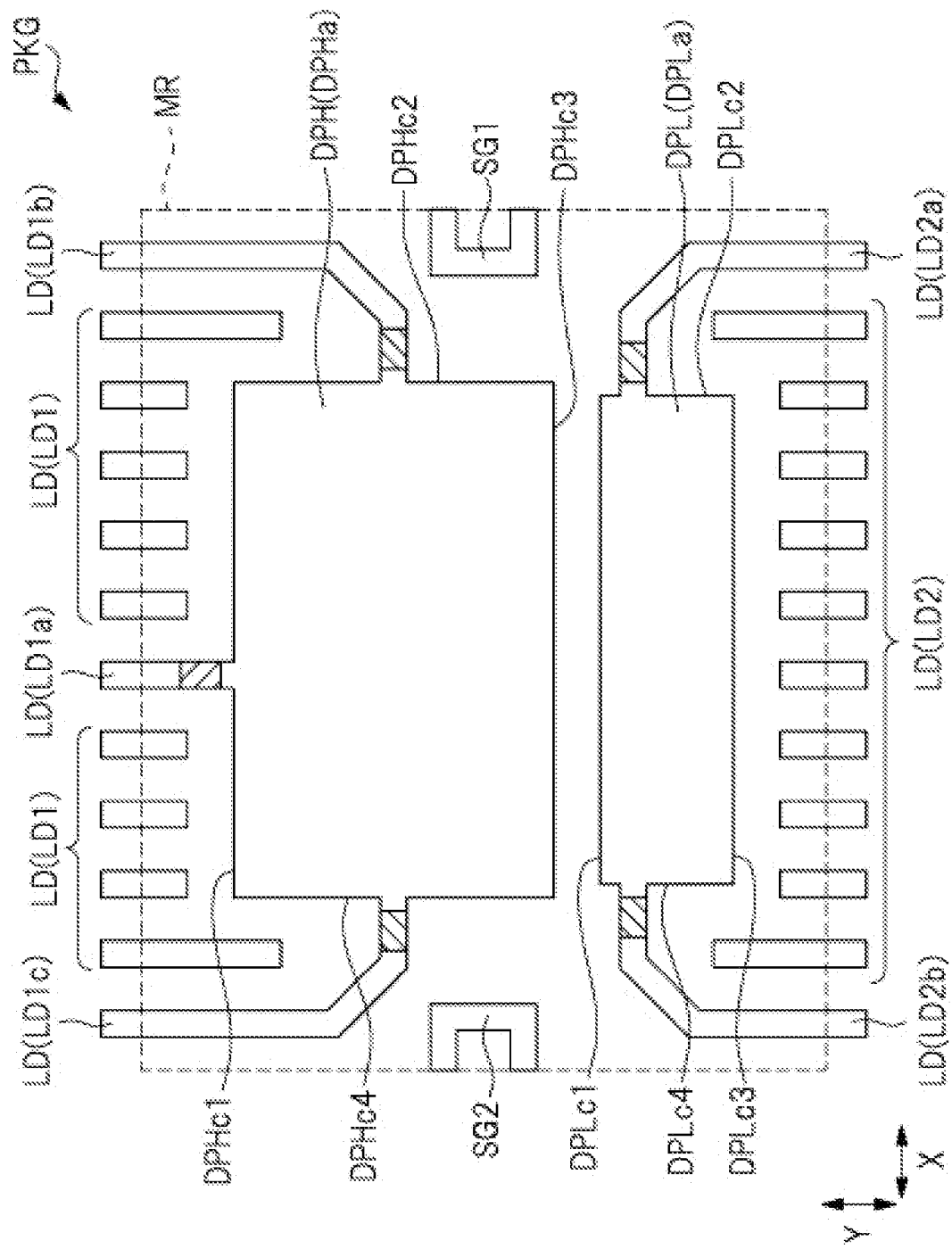
FIG. 5 is a perspective plan view of the semiconductor device according to the one embodiment.
Figure 6:
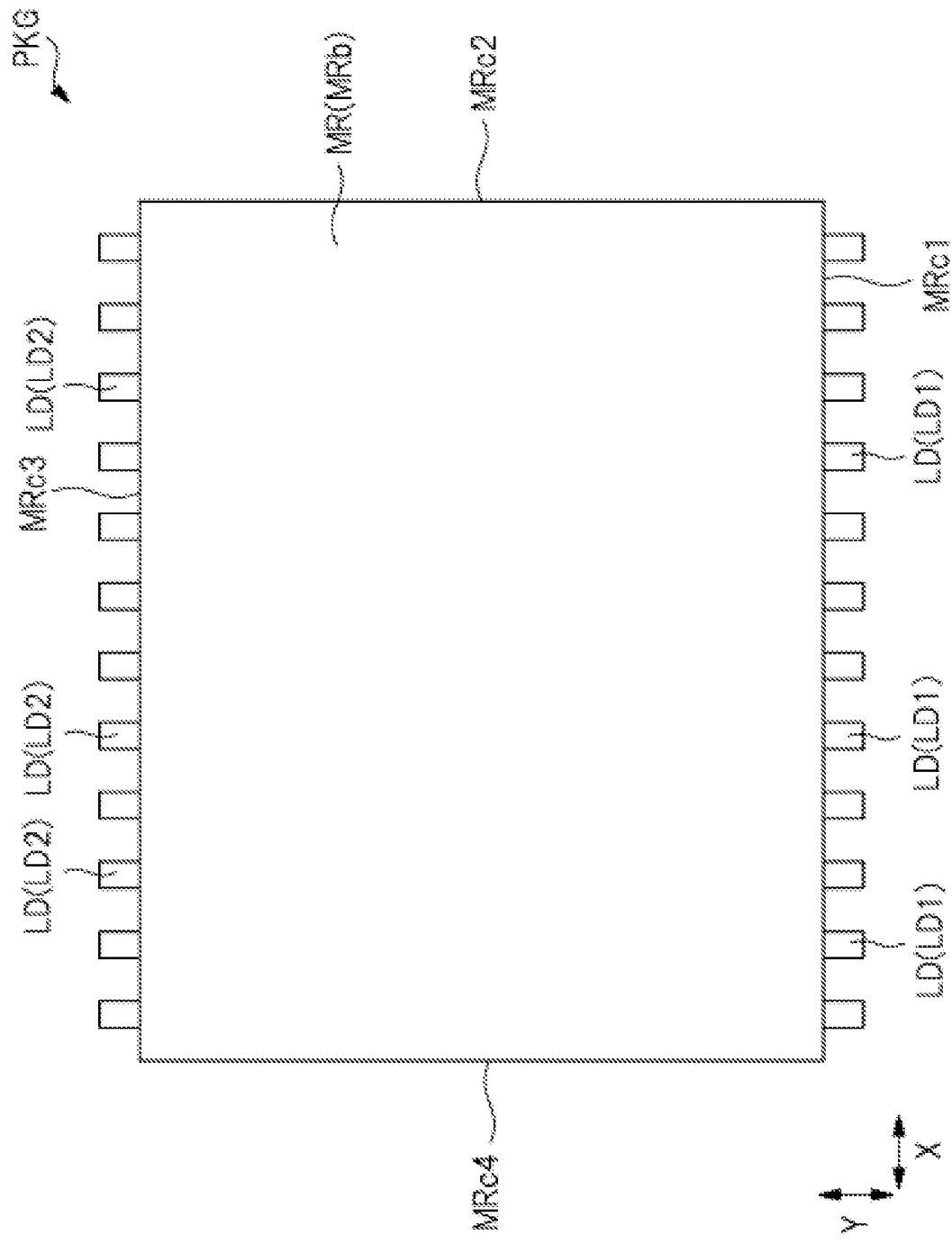
FIG. 6 is a lower surface view of the semiconductor device according to the one embodiment.
Figure 7:
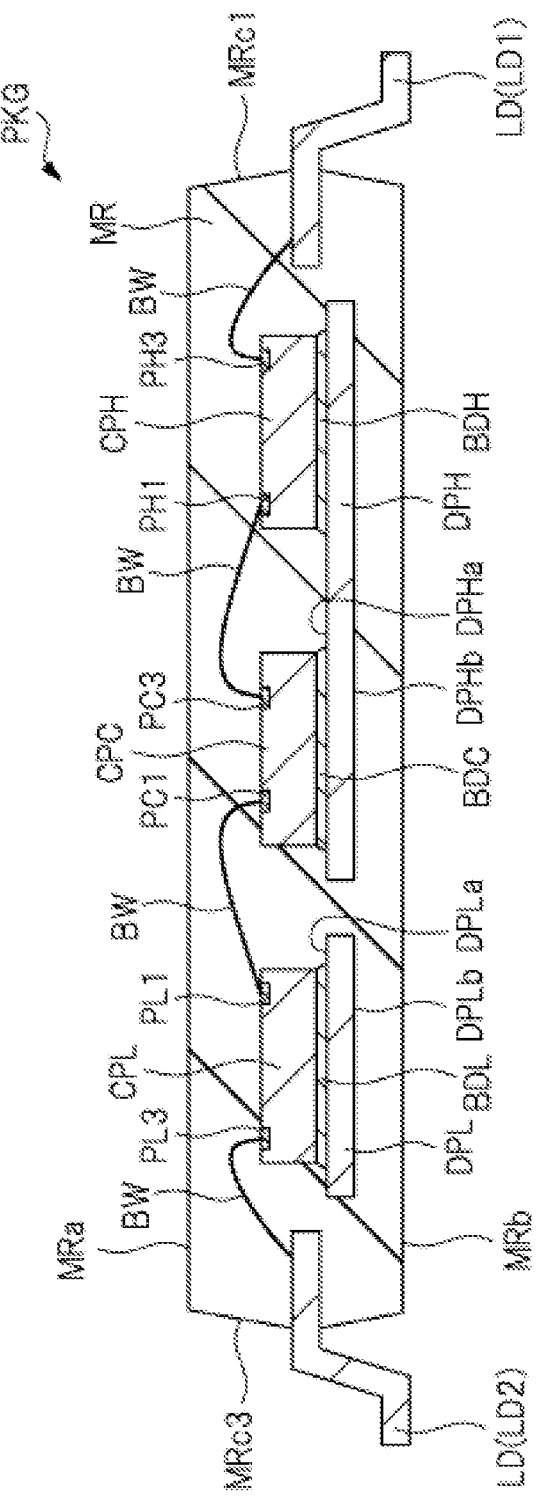
FIG. 7 is a cross-sectional view of the semiconductor device according to the one embodiment.

FIG. 2 is an upper surface view of the semiconductor device PKG according to the present embodiment, FIGS. 3-5 are a perspective plan view of the semiconductor device PKG, FIG. 6 is a lower surface view (back surface view) of the semiconductor device PKG, and FIG. 7 is a cross-sectional view of the semiconductor device PKG. FIG. 3 is a plan perspective view of upper surface of the semiconductor device PKG when the sealing portion MR is seen through. FIG. 4 is a plan perspective view of upper surface of the semiconductor device PKG when the wire BW is further viewed (omitted) in FIG. 3. FIG. 5 is a plan perspective view of upper surface of the semiconductor device PKG when the semiconductor chip CPC,CPH,CPL is further viewed (omitted) in FIG. 4. In FIG. 3 to FIG. 5, the position of the outer periphery of the sealing portion MR is indicated by a dotted line. In addition, a cross-sectional view of the semiconductor device PKG at the position of A1-A1 line in FIGS. 2 and 3 substantially corresponds to FIG. 7. In addition, in FIG. 2 to FIG. 6, the X direction and the Y direction are illustrated. Here, the X direction and the Y direction are directions intersecting with each other, and more specifically, directions orthogonal to each other.

The semiconductor device (semiconductor Package) PKG according to the present embodiment shown in FIGS. 2-7 is a semiconductor device in the form of a resin-encapsulated semiconductor package, here, is a semiconductor device of SOP (Small Outline Package) type. Hereinafter, the configuration of the semiconductor device PKG will be described referring to FIGS. 2 to 7.

The semiconductor device PKG according to the present embodiment shown in FIGS. 2 to 7 has three semiconductor chips CPC,CPH,CPL, a die pad CPC,CPH on which two semiconductor chips DPH are mounted, a die pad DPL on which one semiconductor chip CPL is mounted, a plurality of wire (bonding wire) BW, a plurality of lead LD, and a sealing portion MR for sealing them.

The sealing portion MR as the sealing body is made of, for example, a resin material such as a thermosetting resin material, and may include fillers and the like. For example, the sealing portion MR can be formed using a filler-containing epoxy-resin or the like.

The sealing portion MR has an upper surface MRa which is one main surface, a lower surface (rear surface, bottom surface) MRb which is an opposing main surface of upper surface MRa, and a side surface MRc1,MRc2,MRc3,MRc4 which intersects upper surface MRa and the lower surface MRb. The side surface MRc1,MRc3 is substantially parallel to the X direction, and the side surface MRc2,MRc4 is substantially parallel to the Y direction. In the sealing portion MR, the side surface MRc1 and the side surface MRc3 are located opposite to each other, the side surface MRc2 and the side surface MRc4 are located opposite to each other, the side surface MRc1 intersects the side surface MRc2,MRc4, and the side surface MRc3 intersects the side surface MRc2,MRc4. Each of upper surface MRa and the lower surface MRb is a plane parallel to both the X direction and the Y direction. The planar shape of the sealing portion MR, that is, the planar shape of upper surface MRa and the lower surface MRb of the sealing portion MR is, for example, a rectangular shape. The sealing portion MR has a side surface MR of the sealing portion MRc1 and the side surface MRc2 intersect with each other, a corner portion KD1 at which the side surface MRc4 and the side surface KD3 intersect with each other, a corner portion KD3 at which the side surface MRc3 and the side surface MR of the sealing portion MR intersect with each other, and a corner portion MRc3 at which the side surface MRc4 and the side surface MRc2 of the sealing portion MR intersect with each other.

Each of the plurality of lead LD included in the semiconductor device PKG is partially sealed in the sealing portion MR, and other part thereof protrudes from the side surface of the sealing portion MR to the outside of the sealing portion. Hereinafter, a portion of the lead LD located in the sealing portion MR is referred to as an inner lead portion, and a portion of the lead LD located outside the sealing portion MR is referred to as an outer lead portion. A plating layer (not shown) such as a solder plating layer may be formed on the outer lead portion of the lead LD.

The semiconductor device PKG of the present embodiment is a structure in which a part of the lead LD (the outer lead portion) protrudes from the side surface of the sealing portion MR, and will be described below based on this structure, but the structure is not limited to this structure. For example, it is also possible to adopt a configuration (SON (Small Outline Nonleaded Package) type configuration) in which each lead LD hardly protrudes from the side surface of the sealing portion MR and a part of each lead LD is exposed on the lower surface MRb of the sealing portion.

The plurality of lead included in the semiconductor device PKG is comprised of a plurality of lead LD disposed on the side surface MRc1 of the sealing portion MR, and a plurality of lead LD disposed on the side surface MRc3 of the sealing portion MR. In FIGS. 2 to 7, the lead LD is not disposed on the side surface MRc2,MRc4 of the sealing portion MR. Hereinafter, the lead LD disposed on the side surface MRc1 of the sealing portion MR is referred to as a lead LD1 with reference numeral LD1. Further, the lead LD disposed on the side surface MRc3 of the sealing portion MR is referred to as a lead LD2 with reference numeral LD2.

The outer lead portions protrude out of the sealing portion MR from the side surface MRc1 of the sealing portion MR in the plurality of lead LD. Further, the outer lead portions of the plurality of lead MR disposed on the side surface MRc3 of the sealing portion LD protrude out of the sealing portion MR from the side surface MRc3 of the sealing portion. The outer lead portions of the respective lead LD are bent so that the lower surface near the end portion of the outer lead portion is located on substantially the same plane as the lower surface MRb of the sealing portion MR. The outer lead portion of the lead LD functions as an external connecting terminal portion (external terminal) of the semiconductor device PKG.

The die pad DPL is a chip mounting portion on which the semiconductor chip CPL is mounted, and the die pad DPH is a chip mounting portion on which two semiconductor chip CPC,CPH are mounted. The die pad DPH and the die pad DPL are spaced apart from each other in the X direction, and a part of the sealing portion MR is interposed between the die pad DPH and the die pad DPL. In the die pad DPH,DPL, the die pad DPH is disposed on a side closer to the side surface MR the sealing portion MRc1, and the die pad DPL is disposed on a side closer to the side surface MRc3 of the sealing portion MR. That is, in the Y direction, the die pad DPL is disposed between the die pad MR and the side surface MRc1 of the sealing portion MR, and the die pad DPH is disposed between the die pad DPH and the side surface MRc3 of the sealing portion. The die pad DPH,DPL are sealed in the sealing portion MR and are not exposed from the sealing portion MR. That is, in upper surface MRa and the lower surface MRb of the sealing portion MR, the die pad DPH,DPL are not exposed.

The die pad DPH,DPL and the plurality of lead LD are made of an electrical conductor, and are preferably made of a metallic material such as copper (Cu) or a copper alloy. In addition, the die pad DPH,DPL and the plurality of lead LD are preferably formed of the same material (the same metallic material), so that it is easy to manufacture a lead frame LF to be described later in which the die pad DPH,DPL and the plurality of lead LD are connected, and thus it is easy to manufacture the semiconductor device PKG using the lead frame LF.

The die pad DPH has a upper surface DPHa which is a main surface on the side on which the semiconductor chip CPC,CPH is mounted, a lower surface (rear surface) DPHb which is a main surface on the opposite side, and a side surface DPHc1,DPHc2,DPHc3,DPHc4 which intersects upper surface DPHa and the lower surface DPHb. In the die pad DPH, the side DPHc1 is a side surface located on the side of the sealing portion MR on the side surface MRc1, the side DPHc2 is a side surface located on the side surface MRc4 of the sealing portion MR, the side surface DPHc3 is located on the side surface DPHc3 of the sealing portion MR, the side surface DPHc4 is a side surface located on the side surface DPHc3 of the sealing portion MR. In the die pad DPH, the side DPHc1 and the side DPHc3 are located opposite to each other, the side DPHc2 and the side DPHc4 are located opposite to each other, the side DPHc1 intersects the side DPHc2,DPHc4, and the side DPHc3 intersects the side DPHc2,DPHc4.

Further, the die pad DPL has a upper surface DPLa which is a main surface on the side on which the semiconductor chip CPL is mounted, a lower surface (rear surface) DPLb which is a main surface on the opposite side, and a side surface DPLc1,DPLc2,DPLc3,DPLc4 which intersects upper surface DPLa and the lower surface DPLb. In the die pad DPL, the side DPLc1 is a side surface located on the side of the sealing portion MR on the side surface MRc1, the side DPLc2 is a side surface located on the side surface MRc4 of the sealing portion MR, the side surface DPLc3 is located on the side surface DPLc3 of the sealing portion MR, the side surface DPLc4 is a side surface located on the side surface DPLc3 of the sealing portion MR. In the die pad DPL, the side DPLc1 and the side DPLc3 are located opposite to each other, the side DPLc2 and the side DPLc4 are located opposite to each other, the side DPLc1 intersects the side DPLc2,DPLc4, and the side DPLc3 intersects the side DPLc2,DPLc4. The side surface DPHc3 of the die pad DPH and the side surface DPLc1 of the die pad DPL face each other via a part of the sealing portion MR.

The side DPH of the die pad DPHc1,DPHc3 and the side DPL of the die pad DPLc1,DPLc3 are substantially parallel to the X direction, and the side DPHc2,DPHc4 of the die pad DPL and the side DPLc2,DPLc4 of the die pad are substantially parallel to the Y direction. Each of upper surface DPHa and lower surface DPHb of the die pad DPH and upper surface DPLa and lower surface DPLb of the die pad DPL is a plane substantially parallel to both the X direction and the Y direction. Each planar shape of the die pad DPH,DPL is, for example, a rectangular shape.

Among the plurality of lead LD disposed on the side surface MRc1 of the sealing portion MR, the inner lead portion of the lead LD1$a$ is integrally connected to the side surface DPHc1 of the die pad DPH, the inner lead portion of the lead LD1$b$ is integrally connected to the side surface DPHc2 of the die pad DPH, and the inner lead portion of the lead LD1$c$ is integrally connected to the side surface DPHc4 of the die pad DPH. The lead LD1$a$,LD1$b$,LD1$c$ functions as a suspension lead that supports the die pad DPH to the frame of the lead frame during the manufacture of the semiconductor device PKG. Further, among the plurality of lead LD disposed on the side surface MRc3 of the sealing portion MR, the inner lead portion of the lead LD2$a$ is integrally connected to the side surface DPLc2 of the die pad DPL, and the inner lead portion of the lead LD2b is integrally connected to the side surface DPLc4 of the die pad DPL. The lead LD2a,LD2b functions as a suspension lead that supports the die pad DPL to the frame of the lead frame during the manufacture of the semiconductor device PKG. On the side surface MRc1 of the sealing portion MR, the plurality of lead LD(LD1) are arranged in the X direction, but in these arrangements, the lead LD1b and the lead LD1c are located at both ends. Further, a plurality of lead LD(LD2) are arranged in the X direction on the side surface MRc3 of the sealing portion MR, but in these arrangements, the lead LD2a and the lead LD2b are positioned at both ends.

Each of the semiconductor chip CPC,CPH,CPL has a front surface, which is one main surface, and a back surface, which is an opposing main surface. The semiconductor chip CPH is mounted on upper surface DPHa of the die pad DPH with the back surface of the semiconductor chip CPH facing the die pad DPH via a bonding material BDH. The semiconductor chip CPC is mounted on upper surface DPHa of the die pad DPH with the back surface of the semiconductor chip CPC facing the die pad DPH via a bonding material BDC. The semiconductor chip CPL is mounted on upper surface DPLa of the die pad DPL with the back surface of the semiconductor chip CPL facing the die pad DPL via a bonding material BDL. That is, in the semiconductor chip CPC,CPH,CPL, the semiconductor chip CPC,CPH is mounted on the die pad DPH, and the semiconductor chip CPL is mounted on the die pad DPL. Two semiconductor chip DPH can be mounted on the die pad DPH because the plane size (plane area) of the die pad DPL is larger than the plane size (plane area) of the die pad.

In the upper surface DPHa of the die pad DPH, the region on which the semiconductor chip CPC is mounted and the region on which the semiconductor chip CPH is mounted are separated from each other (specifically, separated in the Y direction). That is, the semiconductor chip CPC and the semiconductor chip CPH are not stacked on each other, but are arranged on upper surface DPHa of the die pad DPH so as to be spaced apart from each other. In a plan view, the semiconductor chip CPL, the semiconductor chip CPC, and the semiconductor chip CPH are arranged in the Y direction, and the semiconductor chip CPC is arranged between the semiconductor chip CPH. The planar size (planar area) of the die pad DPH is larger than the planar size (planar area) of each semiconductor chips CPC,CPH, and the semiconductor chip CPC and the semiconductor chip CPH are included in the upper surface DPHa of the die pad in plan view. In addition, the planar size (planar area) of the die pad DPL is larger than the planar size (planar area) of the semiconductor chip CPL, and the semiconductor chip CPL is included in the upper surface DPLa of the die pad in plan view. The planar shape of each of the semiconductor chips CPC,CPH,CPL is, for example, a rectangular shape. A rectangular shape constituting the planar shape of the semiconductor chips CPC,CPH,CPL has two sides substantially parallel to the X direction and two sides substantially parallel to the Y direction.

As the bonding material BDC,BDH,BDL, a conductive bonding material such as silver-paste can be suitably used. The back surface of the semiconductor chip CPH is bonded and fixed to the die pad DPH via the junction material BDH, the back surface of the semiconductor chip CPC is bonded and fixed to the die pad DPH via the bonding material BDC, and the back surface of the semiconductor chip CPL is bonded and fixed to the die pad DPL via the bonding material BDL. The semiconductor chip CPC,CPH,CPL is sealed in the sealing portion MR and is not exposed from the sealing portion MR.

An insulating junction material can also be used as the bonding material BDC,BDH,BDL. However, when a conductive bonding material is used as the bonding material BDC,BDH,BDL, the heat generated in the semiconductor chip CPC,CPH,CPL can be easily conducted to the die pad DPH,DPL through the bonding material BDC,BDH,BDL.

A plurality of pad PH1,PH2,PH3,PH4 are formed on the semiconductor chip CPH. A plurality of pad PL1,PL2,PL3,PL4 are formed on the semiconductor chip CPL. A plurality of pad PC1,PC2,PC3,PC4 are formed on the semiconductor chip CPC. Note that the "bonding pad", "bonding pad electrode", "pad electrode", or "electrode" is simply referred to as "pad".

The respective pads CPH of the semiconductor chip PH1,PH2,PH3,PH4 are electrically connected to circuits (the reception circuit RX1, the transmission circuit TX2, the drive circuit DR, and the like) formed in the semiconductor chip CPH through the inner wires of the semiconductor chip. Here, the pad PH1 of the semiconductor chip CPH is a pad electrically connected to the pad PC3 of the semiconductor chip CPC via the wire BW. The pad PH2 of the semiconductor chip CPH is a pad electrically connected to the pad PC4 of the semiconductor chip CPC via the wire BW. The pad PH3 of the semiconductor chip CPH is a pad electrically connected to the lead LD1 via the wire BW. The pad PH4 of the semiconductor chip CPH is a pad electrically connected to the die pad DPH via the wire BW. The pad CPH of the semiconductor chip PH1 is electrically connected to the reception circuit RX1 in the semiconductor chip CPH through the internal wiring of the semiconductor chip CPH, and the pad PH2 of the semiconductor chip CPH is electrically connected to the transmission circuit TX2 in the semiconductor chip CPH through the internal wiring of the semiconductor chip CPH.

The respective pads CPL of the semiconductor chip PL1,PL2,PL3,PL4 are electrically connected to circuits (such as the above-described transmitting circuit TX1 and receiving circuit RX2) formed in the semiconductor chip CPL through the inner wiring of the semiconductor chip CPL. Here, the pad PL1 of the semiconductor chip CPL is a pad electrically connected to the pad PC1 of the semiconductor chip CPC via the wire BW. The pad PL2 of the semiconductor chip CPL is a pad electrically connected to the pad PC2 of the semiconductor chip CPC via the wire BW. The pad PL3 of the semiconductor chip CPL is a pad electrically connected to the lead LD2 via the wire BW. The pad PL4 of the semiconductor chip CPH is a pad electrically connected to the die pad DPL via the wire BW. The pad CPL of the semiconductor chip PL1 is electrically connected to the transmitting circuit TX1 in the semiconductor chip CPH through the internal wiring of the semiconductor chip CPL, and the pad PL2 of the semiconductor chip CPL is electrically connected to the receiving circuit RX2 in the semiconductor chip CPL through the internal wiring of the semiconductor chip CPL.

The pad CPC of the semiconductor chip PC1 is a pad electrically connected to the coiled L1a formed in the semiconductor chip CPC. A pad CPC of the semiconductor chip PC2 is a pad electrically connected to the coiled L2a formed in the semiconductor chip CPC. A pad CPC of the semiconductor chip PC3 is a pad electrically connected to the coiled L1b formed in the semiconductor chip CPC. A pad CPC of the semiconductor chip PC4 is a pad electrically connected to the coiled L2b formed in the semiconductor chip CPC.

The plurality of pads PH1 of the semiconductor chip CPH and the plurality of pads PC3 of the semiconductor chip CPC are electrically connected to each other via a wire BW. That is, one end of the wire BW is connected to each of the pad PH1 of the semiconductor chip CPH, and the other end of the wire BW is connected to the pad PC3 of the semiconductor chip CPC. Further, the plurality of pads PH2 of the semiconductor chip CPH and the plurality of pads PC4 of the semiconductor chip CPC are electrically connected to each other via a wire BW. That is, one end of the wire BW is connected to each of the pad PH2 of the semiconductor chip CPH, and the other end of the wire BW is connected to the pad PC4 of the semiconductor chip CPC.

The plurality of pads PL1 of the semiconductor chip CPL and the plurality of pads PC1 of the semiconductor chip CPC are electrically connected to each other via a wire BW. That is, one end of the wire BW is connected to each of the pad PL1 of the semiconductor chip CPL, and the other end of the wire BW is connected to the pad PC1 of the semiconductor chip CPC. Further, the plurality of pads PL2 of the semiconductor chip CPL and the plurality of pads PC2 of the semiconductor chip CPC are electrically connected to each other via a wire BW. That is, one end of the wire BW is connected to each of the pad PL2 of the semiconductor chip CPL, and the other end of the wire BW is connected to the pad PC2 of the semiconductor chip CPC.

Further, the plurality of pads PH3 of the semiconductor chip CPH and the plurality of lead LD1 are electrically connected to each other via a wire BW. That is, one end of the wire BW is connected to each of the pad PH3 of the semiconductor chip CPH, and the other end of the wire BW is connected to the inner lead portion of the lead LD1.

Further, the plurality of pads PL3 of the semiconductor chip CPL and the plurality of lead LD2 are electrically connected to each other via a wire BW. That is, one end of the wire BW is connected to each of the pad PL3 of the semiconductor chip CPL, and the other end of the wire BW is connected to the inner lead portion of the lead LD2.

Further, the plurality of pads PH4 of the semiconductor chip CPH and the die pad DPH are electrically connected to each other via a wire BW. That is, one end of the wire BW is connected to each of the pad PH4 of the semiconductor chip CPH, and the other end of the wire BW is connected to the die pad DPH.

Further, the plurality of pads PL4 of the semiconductor chip CPL and the die pad DPL are electrically connected to each other via a wire BW. That is, one end of the wire BW is connected to each of the pad PHL of the semiconductor chip CPL, and the other end of the wire BW is connected to a lead LD2a,LD2b integrally formed with the die pad DPH.

The wire (bonding wire) BW is a conductive wire. The wire BW is specifically made of a metallic material, but a gold (Au) wire, a copper (Cu) wire, an aluminum (Al) wire, or the like can be suitably used. The wire BW is sealed in the sealing portion MR and is not exposed from the sealing portion MR. In the respective lead LD, the connecting portion of the wire BW is an inner lead portion located in the sealing portion MR.

When the semiconductor device PKG is used, the semiconductor chip CPL in the semiconductor device PKG is electrically connected to a circuit (specifically, the control circuit CC described above) located outside of the semiconductor device PKG via a wire BW (specifically, a wire BW electrically connecting the pad PL3 with the lead LD2) and a lead LD2. When semiconductor device PKG is used, the semiconductor chip CPH in the semiconductor device PKG is electrically connected to a circuit (specifically, an inverter circuit including each power transistor TS1,TS2) located outside of the semiconductor device PKG via a wire BW (specifically, a wire BW electrically connecting the pad PH3 with the lead LD1) and a lead LD1. The driving circuit DR formed in the semiconductor chip CPH is electrically connected to the transmitting circuit TX2 and the receiving circuit RX1 formed in the semiconductor chip CPH via an inner wiring or the like of the semiconductor chip CPH. When the semiconductor device PKG is used, the drive circuit DR formed in the semiconductor chip CPH is electrically connected to the circuit (specifically, the inverter circuit including each power transistor TS1,TS2) located outside of the semiconductor device PKG via the wire BW (specifically, the wire BW electrically connecting the pad PH3 with the lead LD1) and the lead LD1. The power supply potential V1 to be supplied to the inverter circuit including each power transistor TS1,TS2 is higher than the power supply potential V2 to be supplied to the control circuit CC.

<Manufacturing Process of Semiconductor Device>

Next, a manufacturing process (assembly process) of the semiconductor device PKG according to the present embodiment will be described. FIG. 8 to FIG. 12 are a plan view or a cross-sectional view of the semiconductor device PKG during the manufacturing process according to the present embodiment. Of these, FIGS. 8 to 11 are a plan view, and FIG. 12 is a cross-sectional view corresponding to FIG. 7.

In order to manufacture the semiconductor device PKG, a lead frame LF is prepared, and a semiconductor chip CPC,CPH,CPL is prepared. Both the lead frame LF and the semiconductor chip CPC,CPH,CPL may be prepared first, or may be prepared at the same time.

Figure 8:
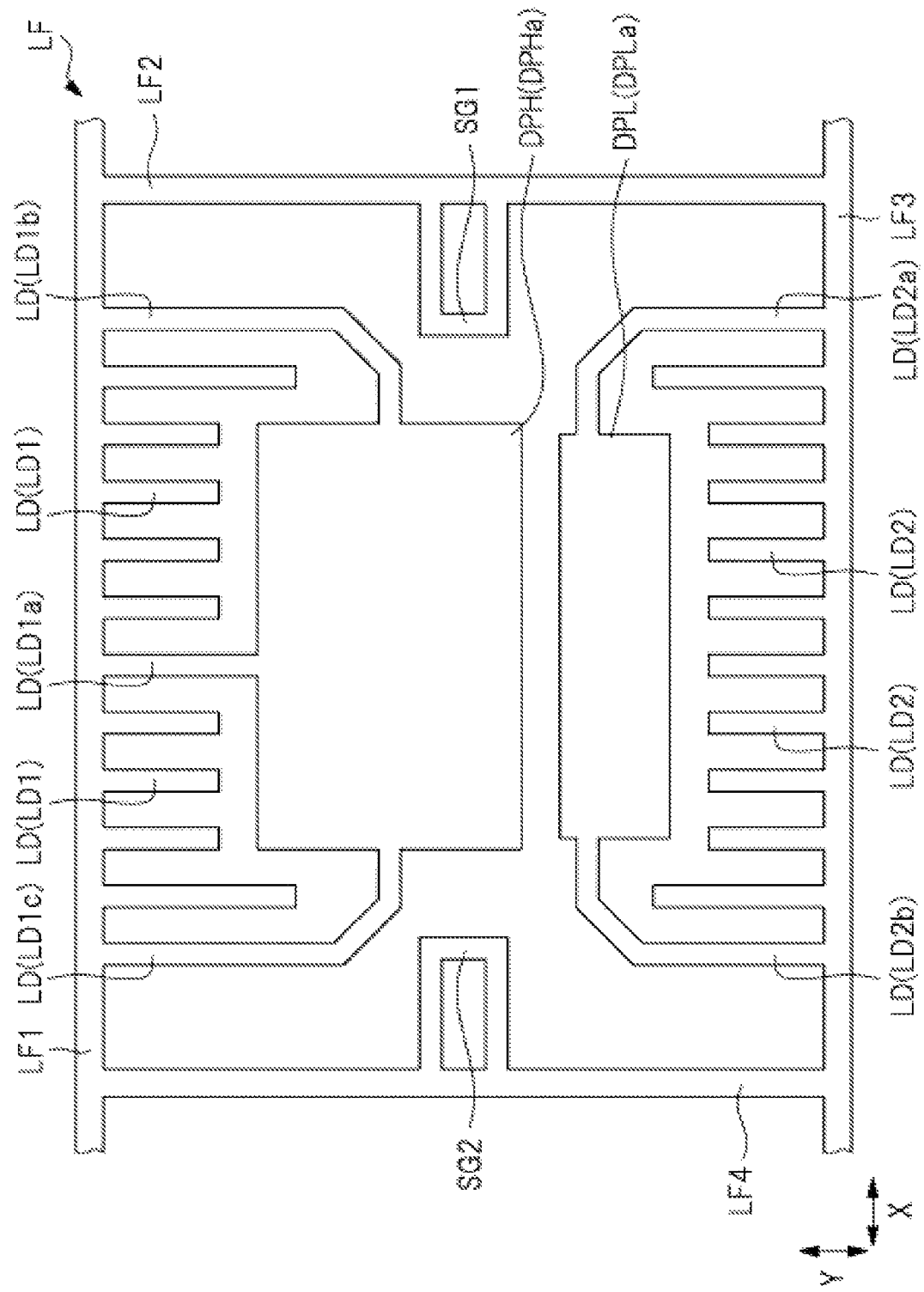
FIG. 8 is a plan view of the semiconductor device during a manufacturing process according to the one embodiment.

As illustrated in FIG. 8, the lead frame LF integrally includes a frame frame, a die pad DPH,DPL, a plurality of lead LD, and a support SG1,SG2. The lead frame LF is made of, for example, a metallic material containing copper (Cu) as a main component, and is specifically made of copper (Cu) or copper (Cu) alloy. FIG. 8 shows an area of the lead frame LF from which one semiconductor device PKG is manufactured.

The frame of the lead frame LF is formed of a frame portion LF1,LF2,LF3,LF4 that surrounds the region to be the semiconductor device PKG formed in a plan view. The frame portion LF1 and the frame portion LF3 are located on opposite sides of each other, the frame portion LF2 and the frame portion LF4 are located on opposite sides of each other, the frame portion LF1 intersects with the frame portion LF2,LF4, and the frame portion LF3 intersects with the frame portion LF2,LF4. In plan view, the frame portion LF1,LF2,LF3,LF4 surrounds the die pad DPH,DPL. The frame portion LF1,LF3 is substantially parallel to the X direction, and the frame portion LF2,LF4 is substantially parallel to the Y direction.

Of the lead LD constituting the lead frame LF, one end of the lead LD1 is connected to the frame portion LF1, and one end of the lead LD2 is connected to the frame portion LF3. Further, the support portion SG1 is connected to the frame portion LF2, and the support portion SG2 is connected to the frame portion LF4. The die pad DPH is connected to the frame portion LF1 via a lead LD1a,LD1b,LD1c, and the die pad DPL is connected to the frame portion LF3 via a lead LD2a,LD2b.

Figure 9:
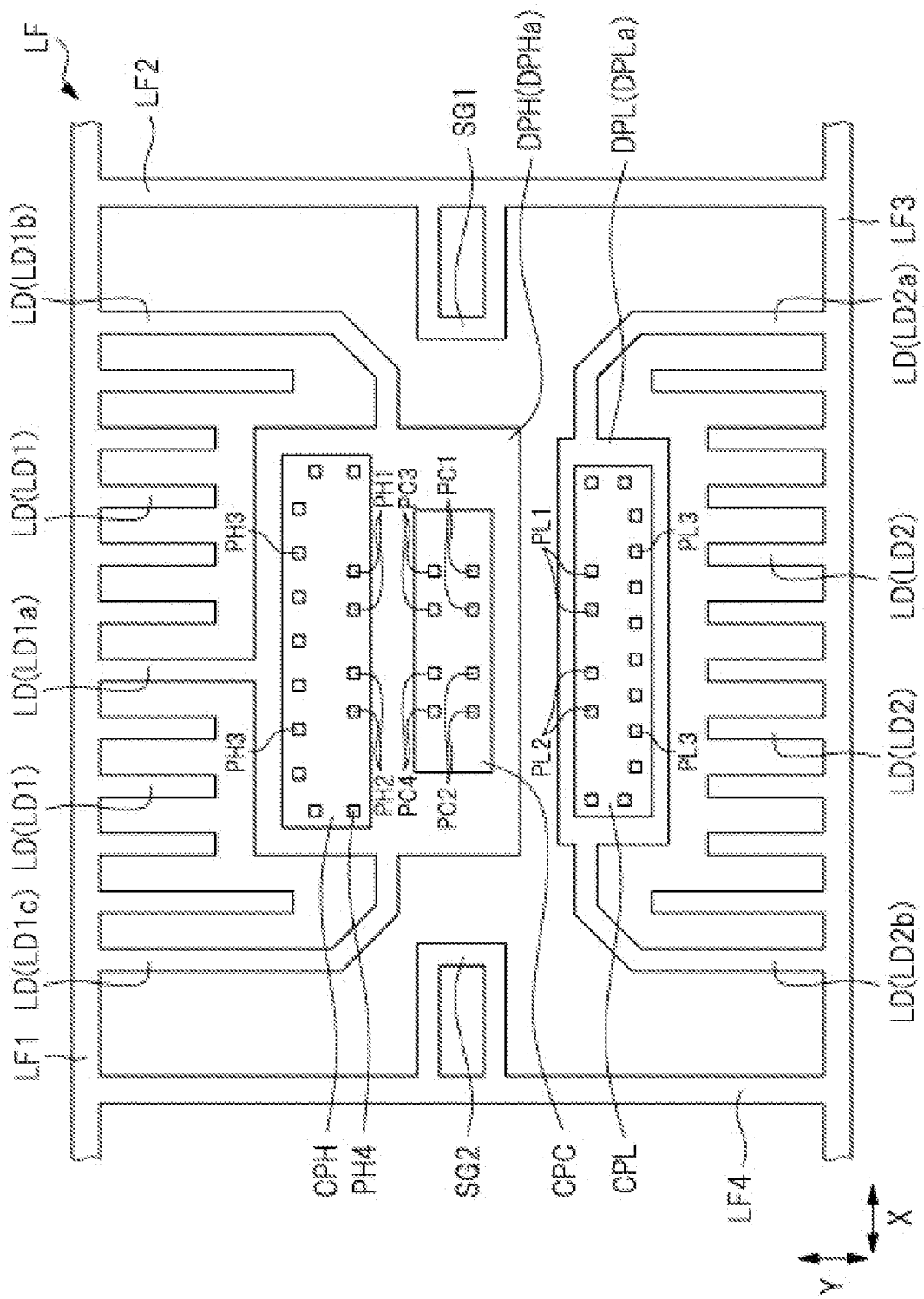
FIG. 9 is a plan view of the semiconductor device during the manufacturing process following FIG. 8.

Next, as shown in FIG. 9, mounting the semiconductor chip CPH on upper surface DPHa of the die pad DPH of the lead frame LF via the junction material BDH (refer to FIG. 7), the semiconductor chip DPH on upper surface DPHa of the die pad BDC via the bonding material CPC (see FIG. 7) mounting the semiconductor chip CPL via the bonding material BDL on upper surface DPLa of the die pad DPL (see FIG. 7). At this time, each of the semiconductor chip CPC,CPH,CPL is mounted with its back surface facing the die pad. Thereafter, the bonding material BDC,BDH,BDL is cured by heat treatment or the like.

Figure 10:
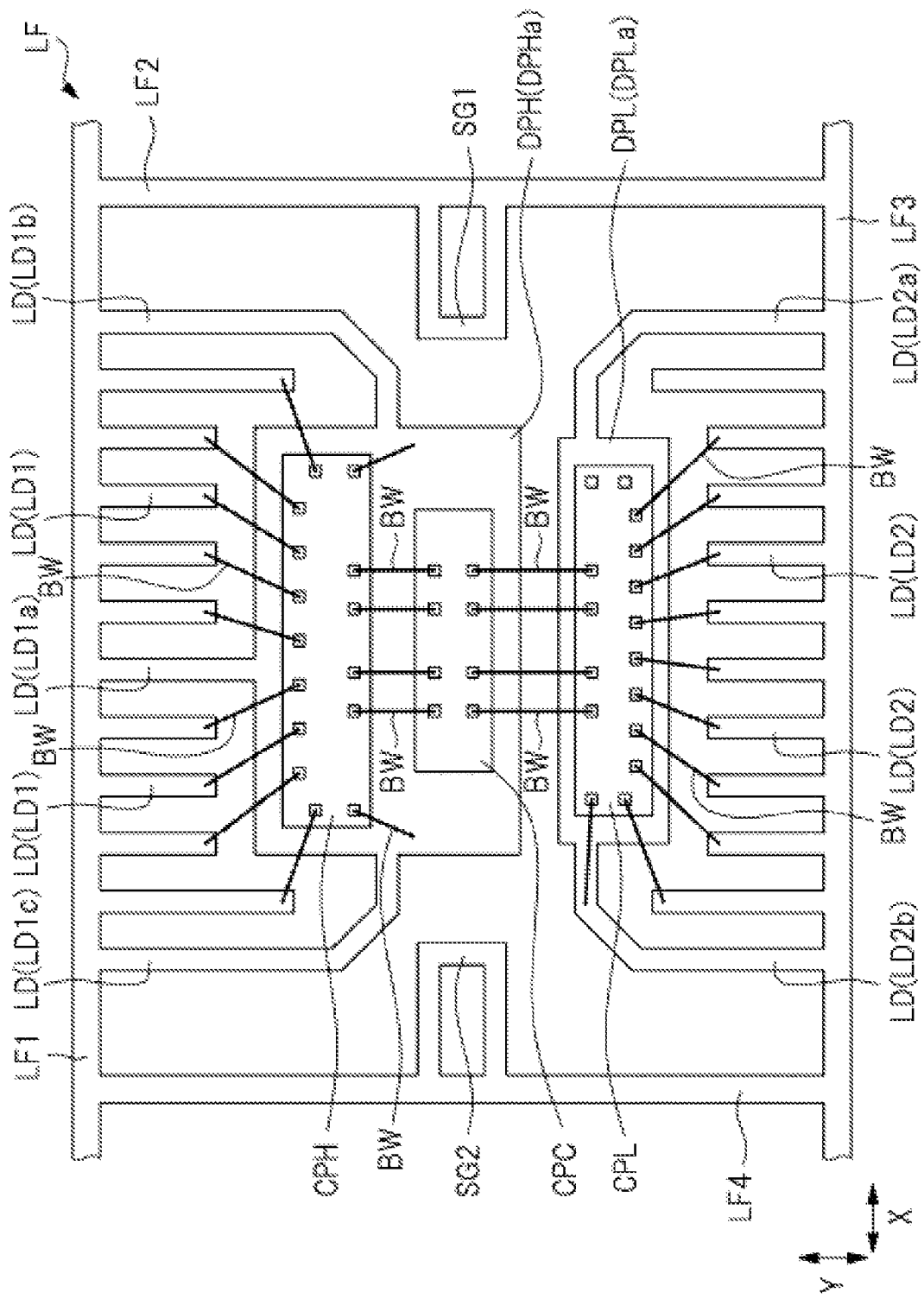
FIG. 10 is a plan view of the semiconductor device during the manufacturing process following FIG. 9.

Next, as shown in FIG. 10, a wire bonding step is performed. In the wire bonding step, between the pad PH1 of the semiconductor chip CPH and the pad PC3 of the semiconductor chip CPC, between the pad PH2 of the semiconductor chip CPH and the pad PC4 of the semiconductor chip CPC, between the pad PL1 of the semiconductor chip CPL and the pad PC1 of the semiconductor chip CPC, and between the pad PL2 of the semiconductor chip CPL and the pad PC2 of the semiconductor chip CPC are electrically connected via a wire BW. Further, between the pad PH3 of the semiconductor chip CPH and the lead LD1, between the pad PL3 of the semiconductor chip CPL and the lead LD2, between the pad PH4 of the semiconductor chip CPH and the die pad DPH, and between the pad PL4 of the semiconductor chip CPL and the lead LD2a,LD2b, respectively, are electrically connected via a wire BW.

Figure 11:
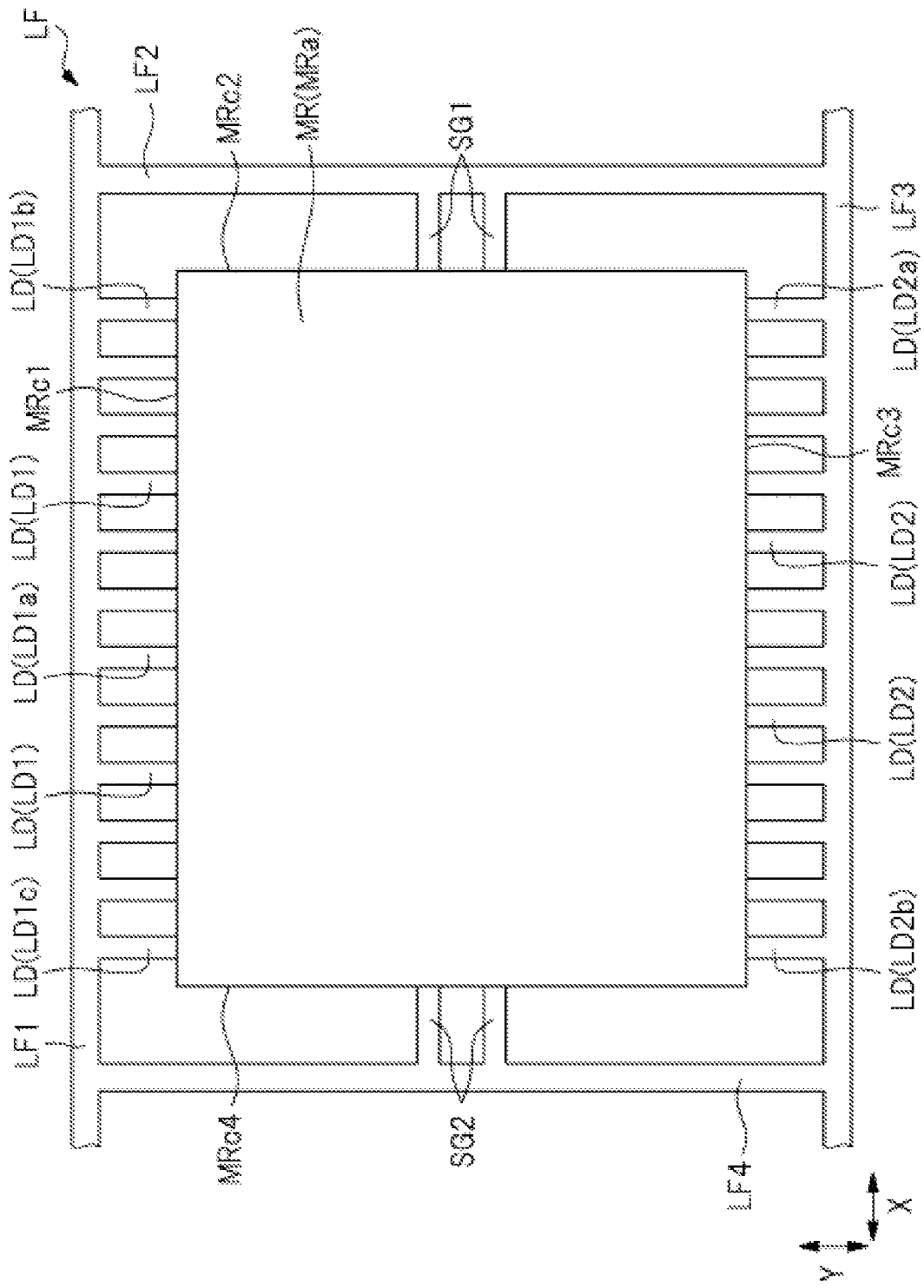
FIG. 11 is a plan view of the semiconductor device during the manufacturing process following FIG. 10.
Figure 12:
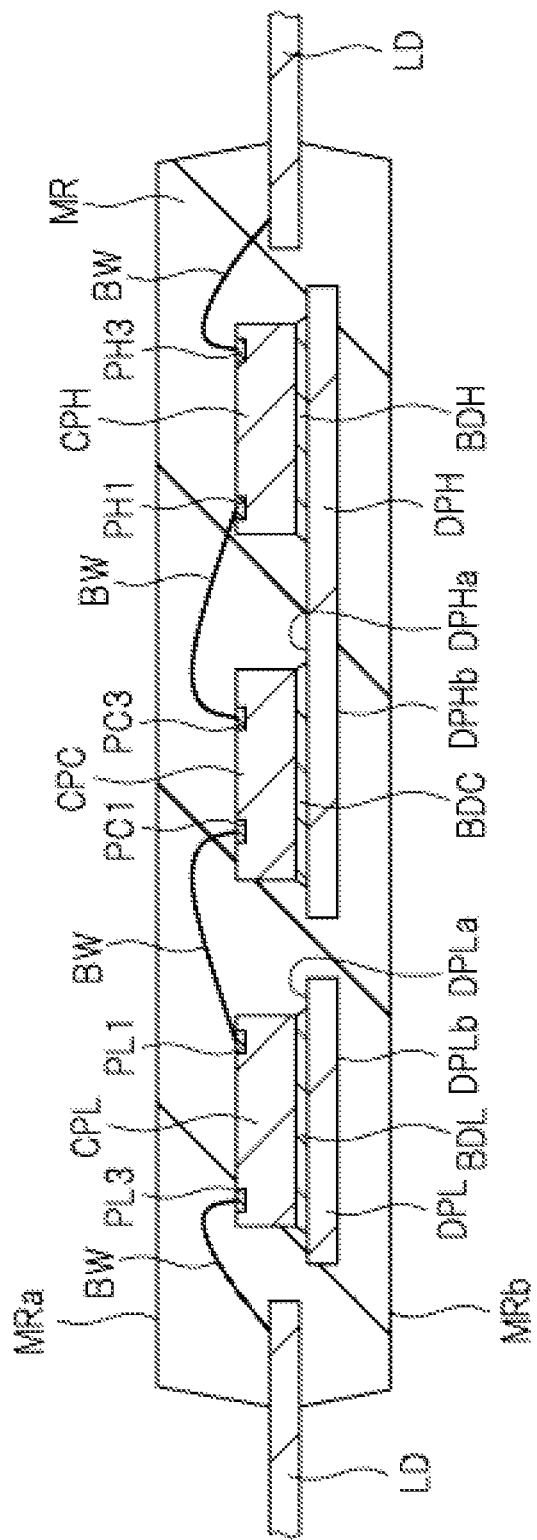
FIG. 12 is a cross-sectional view of the same semiconductor device as FIG. 11 during the manufacturing process.

Next, resin sealing by the molding step (resin-molding step) is performed to form a sealing portion MR for sealing the die pad DPH,DPL, the semiconductor chip CPC,CPH, CPL, the plurality of wire BW, and the inner lead portions of the plurality of lead LD, as shown in FIGS. 11 and 12. Among the side surface MR of the formed sealing portion MRc1,MRc2,MRc3,MRc4, the side surface MRc1 faces the frame portion LF1, the side surface MRc2 faces the frame portion LF2, the side surface MRc3 faces the frame portion LF3, and the side surface MRc4 faces the frame portion LF1. When the sealing portion MR is formed, a portion of each of the support portion SG1,SG2 is also sealed in the sealing portion MR. Specifically, the support portion SG1 integrally includes a portion sealed in the sealing portion MR on the side surface MRc2 of the sealing portion MR, and a portion protruding from the side surface MRc2 of the sealing portion MR to the outside of the sealing portion LF2 and connected to the frame portion. The support portion SG2 integrally includes a portion sealed in the sealing portion MR on the side surface MRc4 of the sealing portion MR, and a portion protruding from the side surface MRc4 of the sealing portion MR to the outside of the sealing portion LF4 and connected to the frame portion.

The sealing portion MR is supported by the side surface MRc1 side plurality of lead LD(LD1,LD1a,LD1b,LD1c) on the frame portion LF1, is supported by the side surface MRc3 plurality of lead LD(LD2,LD2a,LD2b) on the frame portion LF3, is supported on the frame portion LF4 by the side surface MRc2 support portion SG1, and is supported on the frame portion SG1 by the side surface MRc4 support portion SG2. That is, the sealing portion MR is stably supported on the frame portion LF1,LF2,LF3,LF4 by the plurality of lead LD and the support portion SG1,SG2.

Next, plating layers (not shown) are formed on the outer lead portions of the lead LD exposed from the sealing portion MR as needed. Then, outside the sealing portion MR, the lead LD is cut at a predetermined position and separated from the frame (the frame portion LF1,LF3) of the lead frame LF. At this time, after the cutting step of the plurality of lead LD(LD1,LD1a,LD1b,LD1c) on the side surface MRc1 side of the sealing portion MR and the cutting step of the plurality of lead LD(LD2,LD2a,LD2b) on the side surface MRc3 side of the sealing portion MR are performed in any order, the support portion SG1,SG2 of the part protruding from the sealing portion MR is cut. Accordingly, since the lead LD can be cut while the sealing portion MR is supported by the support portion SG1,SG2 on the frame portion LF2,LF4, the lead LD can be cut accurately.

Next, the outer lead portion of the lead LD protruding from the sealing portion MR is bent (lead process, lead forming).

In this way, the semiconductor device PKG shown in FIGS. 2 to 7 are manufactured.

<Semiconductor Chip>

Figure 13:
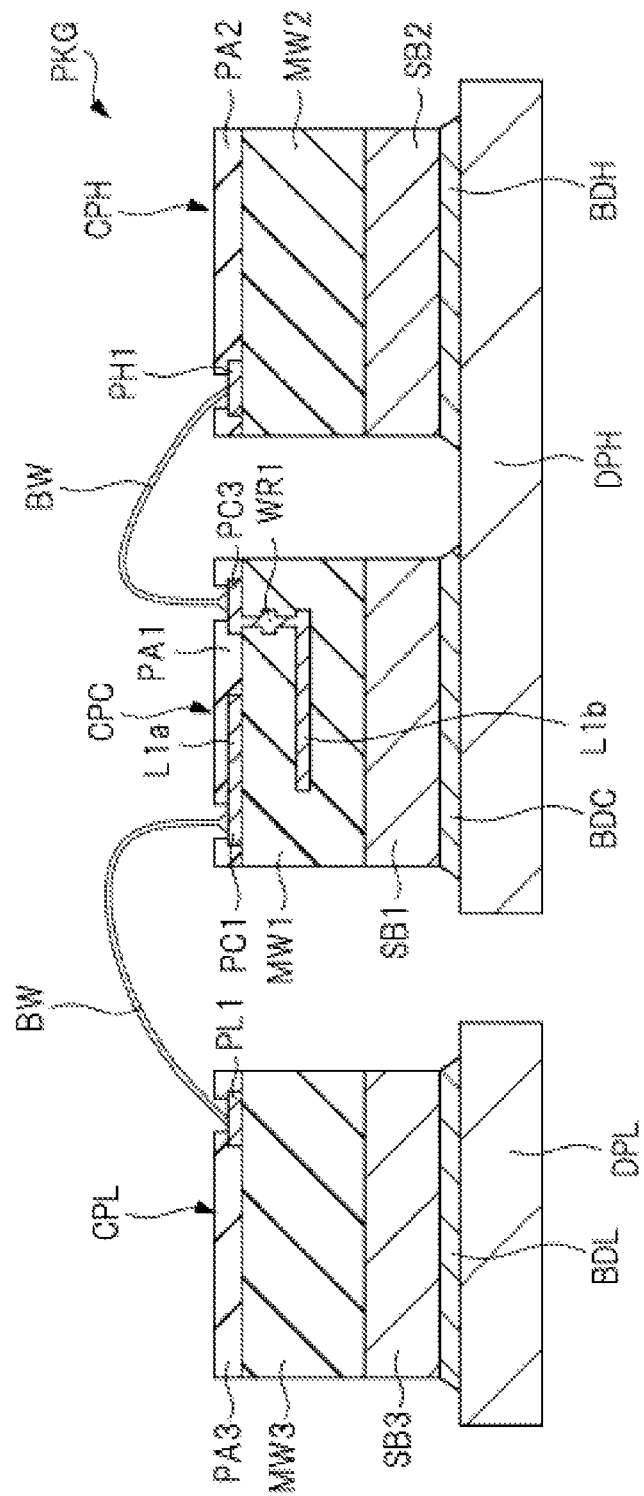
FIG. 13 is a cross-sectional view schematically showing a semiconductor chip in the semiconductor device according to the one embodiment.
Figure 14:
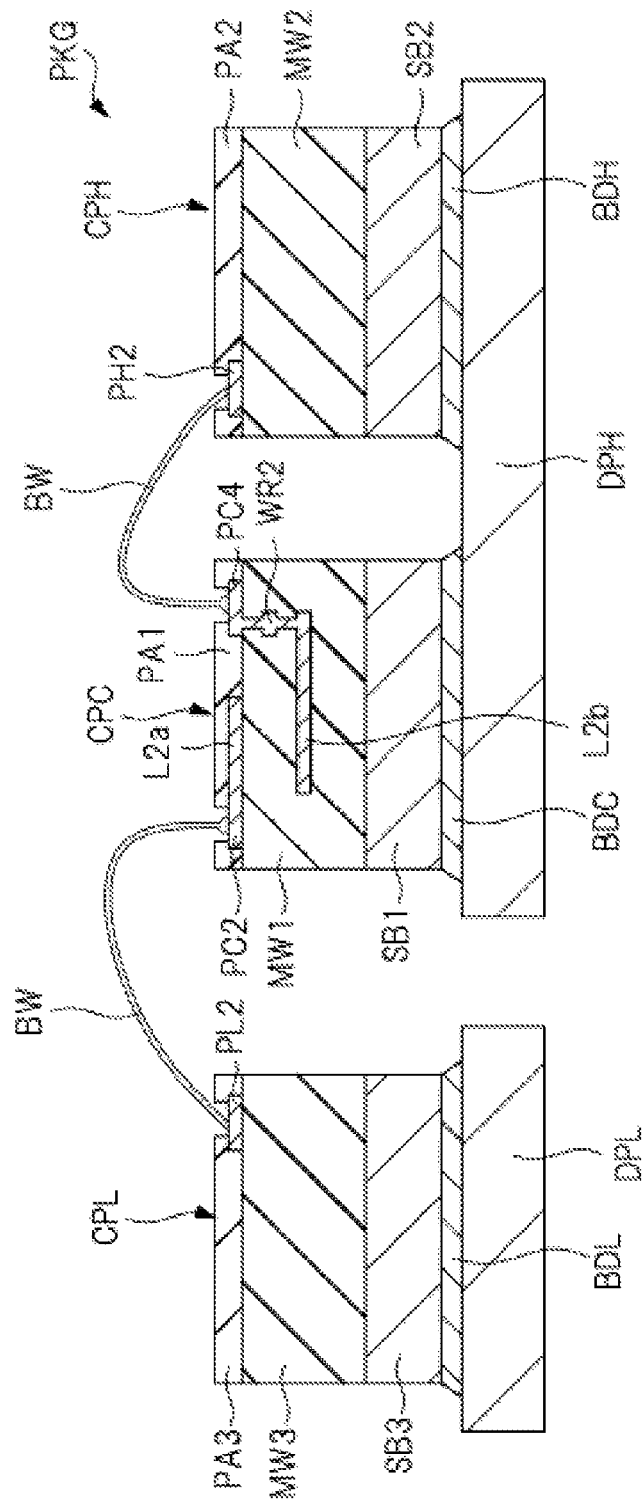
FIG. 14 is a cross-sectional view schematically showing the semiconductor chip in the semiconductor device according to the one embodiment.

FIG. 13 and FIG. 14 are a cross-sectional view schematically showing each semiconductor chip CPC,CPH,CPL in the semiconductor device PKG. FIGS. 13 and 14 are a cross-section that is generally parallel to the Y direction, while FIG. 13 corresponds to a cross-section through the pad PL1, pad PC1, pad PC3 and pad PH1 in FIG. 4, and FIG. 14 corresponds to a cross-section through the pad PL2, pad PC2, pad PC4 and pad PH2 in FIG. 4. In FIG. 13 and FIG. 14, the die pad DPH,DPL, the semiconductor chip CPC, CPH,CPL, and the wire BW are illustrated, but the sealing portion MR is not illustrated.

As shown in FIGS. 13 and 14, the semiconductor chip CPC includes a semiconductor substrate SB1, a multi-layer interconnect MW1 formed thereon, and a protective film PA1 formed thereon. The multi-layer interconnect structural MW1 includes a plurality of interlayer insulating films and a plurality of interconnect layers. The protective film PA1 is a protective film located at the uppermost layer of the semiconductor chip CPC.

The semiconductor chip CPC also includes a coil L1a, L1b,L2a,L2b, and the coil L1a,L1b,L2a,L2b is formed of wiring layers constituting the multi-layer wiring structural MW1. The coil L1a,L1b is shown in FIG. 13 and the coil L2a,L2b is shown in FIG. 14. Among the magnetically coupled coil L1a,L1b, the coil L1a is electrically connected to the pad CPC of the semiconductor chip PC1 via the pad BW of the semiconductor chip CPH and the pad PL1 of the semiconductor chip CPL, and the coil L1b is electrically connected to the pad PH1 of the semiconductor chip CPC via the pad PC1 and the wire CPL (refer to FIG. 13). Further, among the coil L2a,L2b constituting the transformer TR2, the coil L2a is electrically connected to the pad CPC of the semiconductor chip PC2 via the pad PH2 and the wire BW of the semiconductor chip CPH, and the coil L2b is electrically connected to the pad L2b of the semiconductor chip CPL via the pad PC4 and the wire BW of the semiconductor chip CPL (refer to FIG. 14).

In the semiconductor chip CPC, the coil L1b of the coil L1a,L1b is located closer to the die pad DPH (see FIG. 13). In other words, in a cross-sectional view, the coil L1b is located closer to the die pad DPH than the coil L1a. Further, in the semiconductor chip CPC, the coil L2b of the coil L2a,L2b is located closer to the die pad DPH (see FIG. 14). In other words, in a cross-sectional view, the coil L2b is located closer to the die pad DPH than the coil L2a.

That is, in the semiconductor chip CPC, the coil L1a and the coil L1b are formed at positions overlapping each other in a plan view, and the coil L1b is formed below the coil L1a. Further, in the semiconductor chip CPC, the coil L2a and the coil L2b are formed at positions overlapping each other in a plan view, and the coil L2b is formed below the coil L2a.

In the following description, among the primary coil and the secondary coil formed in the semiconductor chip CPC, the lower coil (closer to semiconductor substrate SB1) is referred to as the lower coil, and the upper coil (farther from semiconductor substrate SB1) is referred to as the upper coil. That is, in the semiconductor chip CPC, the coil L1b is formed below the coil L1a, and the coil L2b is formed below the coil L2a. In the semiconductor chip CPC, the coil L1a and the coil L2a are preferably formed in the same layer, and the coil L1b and the coil L2b are preferably formed in the same layer. Each of the coil L1a,L1b,L2a,L2b is formed by a spiral conductive pattern (wiring pattern).

The coiled L1a,L2a is preferably formed in the uppermost wiring layer among the plurality of wiring layers constituting the multi-layer wiring structural MW1. In this case, a coiled L1a,L2a is formed on the uppermost interlayer insulating film among the plurality of interlayer insulating films constituting the multi-layer interconnect structural MW1. The coil L1a,L2a is covered with a protective film PA1, but pad PC1 are connected to both ends of the coil L1a, and pad PC2 are connected to both ends of the coil L2a.

The coil L1b,L2b is formed in a wiring layer lower than the wiring layer in which the coil L1a,L2a is formed, among the plurality of wiring layers constituting the multi-layer wiring structural MW1. Both end portions of the coil L1b are connected to the pad PC3 through the wiring (for example, the wiring WR1 in FIG. 13) included in the multilayer wiring structure MW1, and both end portions of the coil L2b are connected to the pad PC4 through the wiring (for example, the wiring WR2 in FIG. 14) included in the multilayer wiring structure MW1.

The pad PC1,PC2,PC3,PC4 of the semiconductor chip CPC is formed in the uppermost wiring layer among the plurality of wiring layers constituting the multilayer wiring structural MW1, and is exposed from the opening of the protective film PA1. Wire BW are respectively connected to the pad PC1,PC2,PC3,PC4 exposed from the opening of the protective film PA1.

As another form, the coil L1a,L2a can be formed in a wiring layer other than the uppermost wiring layer among the plurality of wiring layers constituting the multi-layer wiring structural MW1, but again, the coil L1b,L2b needs to be formed in a lower layer than the coil L1a,L2a.

A semiconductor device (that is, a transistor such as MOSFET described above) is not formed in the semiconductor chip CPC. That is, a semiconductor device (that is, a transistor such as MOSFET described above) is not formed in semiconductor substrate SB1 constituting the semiconductor chip CPC.

The semiconductor chip CPH includes a semiconductor substrate SB2, a multi-layer interconnect MW2 formed thereon, and a protective film PA2 formed thereon. The multi-layer interconnect structural MW2 includes a plurality of interlayer insulating films and a plurality of interconnect layers. The protective film PA2 is a protective film located at the uppermost layer of the semiconductor chip CPH.

A plurality of semiconductor elements (not shown) such as transistors are formed in semiconductor substrate SB2 constituting the semiconductor chip CPH. The pad PH1, PH2,PH3,PH4 of the semiconductor chip CPH is formed in the uppermost wiring layer among the plurality of wiring layers constituting the multilayer wiring structural MW2, and is exposed from the opening of the protective film PA2. Wire BW are respectively connected to the pad PH1,PH2, PH3,PH4 exposed from the opening of the protective film PA2.

The semiconductor chip CPL includes a semiconductor substrate SB3, a multi-layer interconnect MW3 formed thereon, and a protective film PA3 formed thereon. The multi-layer interconnect structural MW3 includes a plurality of interlayer insulating films and a plurality of interconnect layers. The protective film PA3 is a protective film located at the uppermost layer of the semiconductor chip CPL.

A plurality of semiconductor elements (not shown) such as transistors are formed in semiconductor substrate SB3 constituting the semiconductor chip CPL. The pad PL1,PL2, PL3,PL4 of the semiconductor chip CPL is formed in the uppermost wiring layer among the plurality of wiring layers constituting the multilayer wiring structural MW3, and is exposed from the opening of the protective film PA3. Wire BW are respectively connected to the pad PL1,PL2,PL3,PL4 exposed from the opening of the protective film PA3.

In the semiconductor device PKG, when no signal is required to be transmitted from the semiconductor chip CPH to the semiconductor chip CPL, the semiconductor chip CPH does not include the transmission circuit TX2, the semiconductor chip CPL does not have the reception RX2, and the semiconductor chip CPC does not include a transformer TR2 (coil CPH). Here, the semiconductor chip CPH does not have the pad PH2, the semiconductor chip CPL does not have the pad PL2, and the semiconductor chip CPC does not have the pad PC2,PC4. At least one transformer is formed in the semiconductor chip CPC, but the number of transformers can be varied.

Examined Example

Figure 15:
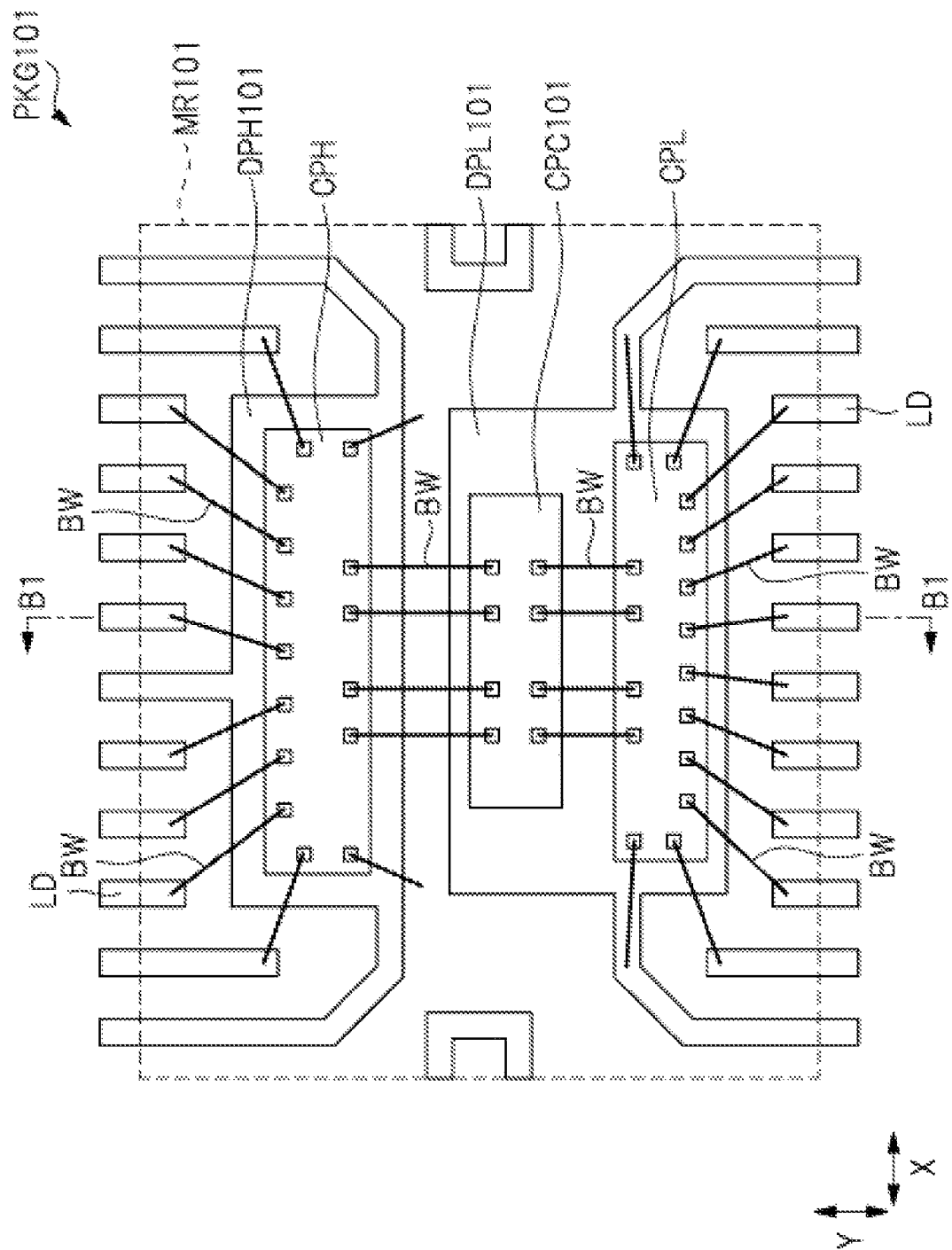
FIG. 15 is a perspective plan view of a semiconductor device according to a first examined example.
Figure 16:
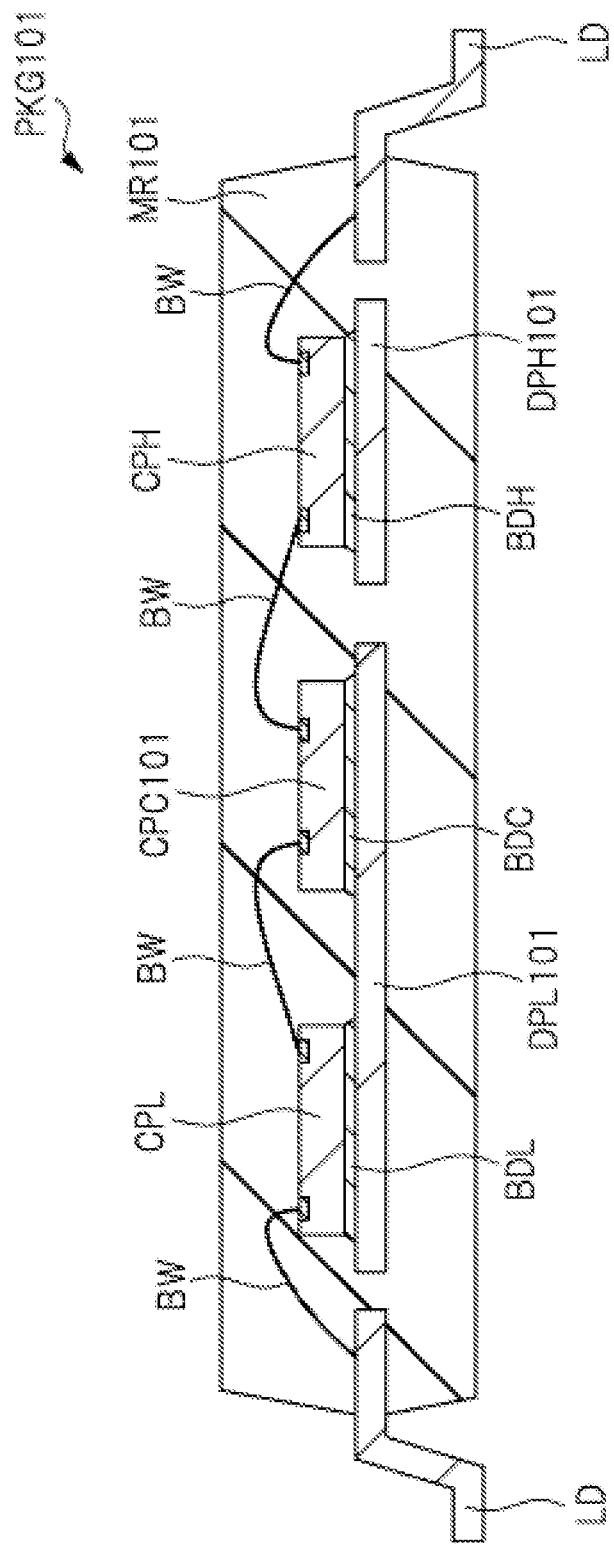
FIG. 16 is a cross-sectional view of the semiconductor device according to the first examined example.

FIG. 15 is a perspective plan view of a semiconductor device PKG101 according to the first examined example studied by the present inventor, and corresponds to FIG. 3. FIG. 16 is a cross-sectional view of the semiconductor device PKG101 according to the first examined example, and corresponds to FIG. 7. A cross-sectional view of the semiconductor device PKG101 at the position of B1-B1 line in FIG. 15 corresponds approximately to FIG. 16.

The semiconductor device PKG101 of the first examined example shown in FIGS. 15 and 16 has a die pad DPH101, DPL101 instead of the die pad DPH,DPL. A semiconductor chip CPH is mounted on the die pad DPH101 via a bonding material BDH, and a semiconductor chip CPL is mounted on the die pad DPL101 via a bonding material BDL. The semiconductor chip CPC101 corresponding to the semiconductor chip CPC is mounted not on the die pad DPH101 but on the die pad DPL101 via a bonding material BDC. Two semiconductor chip DPL101 can be mounted on the die pad DPL101 because the plane size (plane area) of the die pad DPH101 is larger than the plane size (plane area) of the die pad.

When the three semiconductor chips CPC101,CPH,CPL are mounted on separate die pads, the planar size (planar area) of the semiconductor device is increased, but in the case of the first examined example of the semiconductor device PKG101, the planar size (planar area) of the semiconductor device can be reduced by mounting the two semiconductor chip CPC101,CPL on the die pad DPL101.

However, according to studies by the present inventors, it has been found that the following problems can occur in the semiconductor device PKG101 of the first examined example.

Among the semiconductor chip CPH,CPL included in the semiconductor device PKG101 of the first examined example, the semiconductor chip CPH has a large amount of heat (power consumed) during operation. This is because the semiconductor chip CPH has a driving circuit DR that operates at a higher power supply voltage than the transmitting circuit TX1 and the receiving circuit RX2.

In the semiconductor device PKG101 of the first examined example, heat generated in the semiconductor chip CPH is conducted to the die pad DPH101 through the junction material BDH, and heat generated in the semiconductor chip CPC101,CPL is conducted to the die pad DPL101 through the bonding material BDC,BDL. The die pad DPH101,DPL101 is sealed in the sealing portion MR101 corresponding to the sealing portion MR, and is not exposed from the sealing portion MR101. This is because, if the die pad MR101 is exposed on the lower surface of the sealing portion DPH101,DPL101, creeping discharge (discharge generated along the surface of the sealing portion MR101) is feared between the exposed portion of the die pad DPH101 and the exposed portion of the die pad DPL101.

For this reason, for a semiconductor chip CPH having a larger heat generation value than that of the semiconductor chip CPL, it is desired to increase the volume of the die pad DPH101 on which the semiconductor chip CPH is mounted in order to suppress the temperature rise caused by the heat generation. However, increasing the thickness of the die pad DPH101 in order to increase the volume of the die pad DPH101 leads to increasing the thickness of the sealing portion MR101, which is undesirable because it leads to an increase in the thickness of the semiconductor device PKG101. Also, increasing the planar size (planar area) of the die pad DPH101 in order to increase the volume of the die pad DPH101 leads to an increase in the planar size (planar area) of the sealing portion MR101, which leads to an increase in the planar size (planar area) of the semiconductor device PKG101, which is undesirable. In other words, when CPL of the semiconductor chip CPH on which the semiconductor chip DPH101 having a larger heat generation value than that of the semiconductor chip is mounted is small, the temperature-rise of the semiconductor chip CPH due to the heat generation increases during the operation of the semiconductor chip CPH, and thus the reliability of the semiconductor device PKG101 may deteriorate. It is desirable to improve the reliability of semiconductor device by suppressing a rise in CPH of the semiconductor chip caused by heat generation, and to achieve compactness of semiconductor device.

Key Features and Effects

The semiconductor device PKG of the present embodiment is a semiconductor device that incorporates three semiconductor chip CPC,CPH,CPL. The semiconductor chip CPC includes a magnetically coupled coil L1a,L1b, and the coil CPC in the semiconductor chip L1a is electrically connected to a circuit (here, a transmitting circuit TX1) formed in the semiconductor chip CPL, and the coil L1b in the semiconductor chip CPC is electrically connected to a circuit (here, a receiving circuit RX1) formed in the semiconductor chip CPH. Thus, in the semiconductor device PKG, a signal can be transmitted between the semiconductor chip CPL and the semiconductor chip CPH through the coil L1a,L1b magnetically coupled thereto.

One of the main features of the present embodiment is that the semiconductor device PKG has two die pad DPH,DPL and three semiconductor chip CPC,CPH,CPL, two semiconductor chip CPC,CPH are mounted on the die pad DPH, and one semiconductor chip CPL is mounted on the die pad DPL.

Unlike the present embodiment, when three semiconductor chips CPC,CPH,CPL are respectively mounted on three die pads, the planar size (planar area) of the semiconductor device is increased, but in comparison with the case of the semiconductor device PKG according to present embodiment, the planar size (planar area) of the semiconductor device can be reduced by mounting two semiconductor chips CPC,CPH on the die pad DPH.

Further, unlike the present embodiment, it is assumed that a transformer TR1,TR2 is formed in one of the semiconductor chip CPH,CPL, for example, the semiconductor chip CPH, without using the semiconductor chip CPC. In this case, in the semiconductor chip CPH, since a semiconductor device such as a transistor is not formed in the planar region in which the coil constituting the transformer TR1,TR2 is formed, the planar size of the semiconductor chip CPH is considerably increased, and the manufacturing cost of the semiconductor chip CPH is increased, and consequently the manufacturing cost of semiconductor device is increased. On the other hand, in the present embodiment, since the transformer TR1,TR2 is formed in the semiconductor chip CPC different from the semiconductor chip CPH,CPL, the planar size of the semiconductor chip CPC,CPH,CPL can be suppressed, and the manufacturing cost of the semiconductor device PKG can be reduced.

In addition, the semiconductor device PKG according to the present embodiment can achieve both a suppression of rising a temperature of the semiconductor chip CPH due to heat generation and a size reduction of the semiconductor device PKG. This will be described below.

The planar size (planar area) of the die pad DPL of the semiconductor device PKG of the present embodiment may be smaller than the planar size (planar area) of the die pad DPL101 of the semiconductor device PKG101 of the first examined example. This is because the first examined example of the semiconductor device PKG101 die pad DPL101 mounts two semiconductor chip CPC,CPL, so that the planar dimensions of the die pad DPL101 are increased because the planar size of each of the two semiconductor chips CPC,CPL need to be ensured to be as large as possible. In comparison, the die pad DPL of the semiconductor device PKG of the present embodiment can be made smaller than the plane size of the die pad DPL101 by ensuring the plane size of the die pad CPL to the extent that it is possible to arrange one semiconductor chip.

In addition, the planar size (planar area) of the die pad DPH of the semiconductor device PKG of the present embodiment may be larger than the planar size (planar area) of the die pad DPH101 of the semiconductor device PKG101 of the first examined example. This is because the die pad DPH101 of the semiconductor device PKG101 of the first examined example only needs to secure a planar size in which one semiconductor chip CPH can be arranged, whereas the die pad DPH of semiconductor device PKG of the present embodiment needs to secure an area in which two semiconductor chip CPC,CPH can be arranged.

Here, it is assumed that the plane size of the die pad DPH101 in the first examined example and the plane size of the die pad DPH in the present embodiment are the same. In this case, since the plane size of the die pad DPL in present embodiment can be smaller than the plane size of the die pad examined example in the first examined example, the plane size (plane area) of the semiconductor device PKG of the present embodiment can be smaller than the plane size (plane area) of the semiconductor device PKG101 of the first PKG101.

That is, in the present embodiment, by mounting the semiconductor chip CPC not on the die pad DPL on which the semiconductor chip CPL is mounted but on the die pad DPH on which the semiconductor chip CPH is mounted, it is possible to increase the planar size of the die pad DPH on which the semiconductor chip CPH is mounted while suppressing the planar size of the semiconductor device PKG.

The power consumption during the operation of the semiconductor chip CPH is larger than the power consumption during the operation of the semiconductor chip CPL, and therefore the heat generation during the operation of the semiconductor chip CPH is larger than the heat generation during the operation of the semiconductor chip CPL. Heat generated in each semiconductor chip CPH,CPC is conducted to the die pad DPH through each bonding material BDH,BDC, and heat generated in the semiconductor chip CPL is conducted to the die pad DPL through the bonding material BDL. In the present embodiment, as described above, since the planar size of the die pad DPH can be made larger than the planar size of the die pad DPL, the heat generated in the semiconductor chip CPH during the operation of the semiconductor chip CPH can be released through the die pad DPH rather than the semiconductor device PKG101 of the first examined example. Therefore, the reliability of the semiconductor device PKG can be improved. On the other hand, compared to the semiconductor chip CPH, the semiconductor chip CPL generates less heat than the semiconductor chip CPH during its operation. Therefore, even if the planar size (planar area) of the die pad DPL on which the semiconductor chip CPL is mounted is reduced, the reliability of the semiconductor device PKG is not affected.

That is, in the present embodiment, in order to increase the planar size of the die pad DPH on which the semiconductor chip CPH having a large amount of heat generation at the time of operation is mounted while preventing an increase in the planar size of the semiconductor device PKG, the semiconductor chip CPC is mounted not on the die pad DPL on which the semiconductor chip CPL is mounted but on the die pad DPH on which the semiconductor chip CPH is mounted. Thus, the total area of the die pad DPH and the die pad DPL is substantially the same as the total area of the die pad DPH101 and the die pad DPL101 in the first examined example, and the planar size of the die pad DPH on which the semiconductor chip CPH having a large amount of heat generation at the time of the operation is mounted can be increased. As a result, it is possible to suppress the temperature-rise of the semiconductor chip CPH caused by heat generation and to achieve compactness of the semiconductor device PKG.

Another of the main features of the present embodiment is that, in the semiconductor chip CPC, the coil L1a,L1b has a coil L1b located on a side close to the die pad DPH, and a coil L2a,L2b has a coil L2b located on a side close to the die pad DPH. In other words, in cross-sectional view, the coil L1b is located closer to the die pad DPH than the coil L1a, and the coil L2b is located closer to the die pad DPH than the coil L2a. Accordingly, the reliability of semiconductor device can be further improved. This will be described below.

In the transformer TR1,TR2, a large potential difference may be generated between the primary coil and the secondary coil. Conversely, since a large potential difference may occur, a primary coil and a secondary coil magnetically coupled without being connected by a conductor are used for signal transmission. Therefore, in forming the transformer TR1,TR2 in the semiconductor chip CPC, it is essential to keep dielectric strength between the primary coil and the secondary coil as high as possible in order to improve the reliability of the semiconductor package PKG incorporating the semiconductor chip CPC,CPH,CPL or the electronic device using the same. In order to increase dielectric strength between the primary coil and the secondary coil formed in the semiconductor chip CPC, it is effective to increase the total thickness of the interlayer insulating film between the primary coil and the secondary coil.

However, when a large potential difference is generated between the primary coil and the secondary coil formed in the semiconductor chip CPC, a large potential difference may also be generated between semiconductor substrate SB1 and the coil constituting the semiconductor chip CPC.

Figure 17:
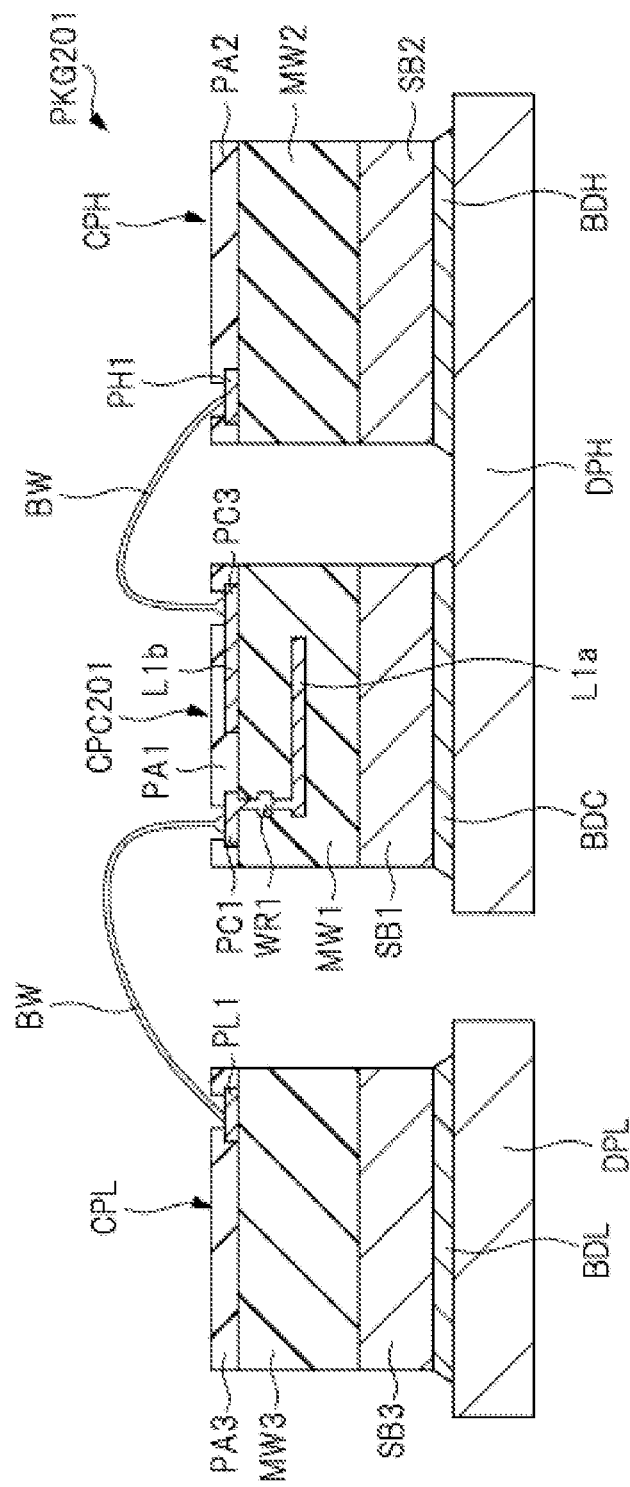
FIG. 17 is a cross-sectional view schematically showing a semiconductor chip in a semiconductor device according to a second examined example.

FIG. 17 is a cross-sectional view schematically showing a semiconductor chip CPC201,CPH,CPL in a semiconductor device PKG201 according to the second examined example studied by the present inventor, and corresponds to FIG. 13. The semiconductor chip CPC201 shown in FIG. 17 corresponds to the semiconductor chip CPC. Similarly to the present embodiment, in FIG. 17 (second examined example), the semiconductor chip CPC201 corresponding to the semiconductor chip CPC is mounted not on the die pad DPL but on the die pad DPH.

However, in the semiconductor chip CPC201 shown in FIG. 17 and the semiconductor chip CPC of the present embodiment, the vertical relationship of the magnetically coupled coils is reversed. That is, in the case of the semiconductor chip CPC201 shown in FIG. 17, the coil L1a of the magnetically coupled coil L1a,L1b is located closer to the die pad DPH than the coil L1b, and the coil L2a of the magnetically coupled coil L2a,L2b is located closer to the die pad DPH than the coil L2b. That is, in the semiconductor chip CPC201 shown in FIG. 17, a coil L1a is formed below the coil L1b, and a coil L2a is formed below the coil L2b. In FIG. 17, the coiled L2a,L2b is not shown.

In the semiconductor chip CPC,CPC201, dielectric strength between the primary coil and the secondary coil can be ensured by increasing the interlayer insulating film between the primary coil and the secondary coil. On the other hand, in the semiconductor chip CPC,CPC201, if the thickness of the interlayer insulating film between the lower coil and semiconductor substrate SB1 of the primary coil and the secondary coil is also increased, the thickness of the entire multi-layer interconnect MW1 is increased, which leads to an increase in the thickness of the semiconductor chip CPC,CPC201. This leads to an increase in the thickness of the seal MR,MR101, which leads to an increase in the thickness of semiconductor device, which is undesirable.

In addition, it is desirable that the respective thicknesses of the semiconductor chip CPC be substantially the same in order to accurately connect the pad PC3,PC4 of the semiconductor chip CPH and the pad PH1,PH2 of the semiconductor chip CPL and the pad PC1,PC2 of the semiconductor chip CPC and the pad PL1,PL2 of the semiconductor chip CPL via the wire BW in the wire bonding step. Therefore, when the thickness of the semiconductor chip CPC is increased, it is desired to increase the thickness of the semiconductor chip CPH accordingly, but when the thickness of the semiconductor chip CPH is increased, it is difficult to connect the pad PH3 of the semiconductor chip CPH and the lead LD with a wire BW. This is because increasing the thickness of the semiconductor chip CPH increases the risk that the pad PH3 of the semiconductor chip CPH and the wire LD connecting the lead BW will touch upper surface end portion of the semiconductor chip CPH. In this respect, too, the thickness of the semiconductor chip CPH,CPC is preferably not too large.

On the other hand, in order to reduce the thickness of the semiconductor chip CPC, reducing the thickness of semiconductor substrate SB1 constituting the semiconductor chip CPC leads to reducing the thickness of the semiconductor wafer for manufacturing the semiconductor chip CPC. When the thickness of the semiconductor wafer is reduced, the risk of chipping or cracking of the semiconductor wafer during transfer of the semiconductor wafer is increased, and the transfer of the semiconductor wafer itself is also difficult. In view of this, it is also not advisable to make the thickness of semiconductor substrate SB1 constituting the semiconductor chip CPC too thin.

Therefore, in order to sufficiently secure dielectric strength between the primary coil and the secondary coil formed in the semiconductor chip CPC while suppressing the thickness of the semiconductor chip CPC to some extent (that is, to secure the thickness of the interlayer insulating film between the primary coil and the secondary coil), it is effective to suppress the thickness of the interlayer insulating film between the lower coil and semiconductor substrate SB1 of the primary coil and the secondary coil formed in the semiconductor chip CPC.

In the following description, among the primary coil and the secondary coil formed in the semiconductor chip CPC, the lower coil (closer to semiconductor substrate SB1) is referred to as the lower coil, and the upper coil (farther from semiconductor substrate SB1) is referred to as the upper coil. For the present embodiment semiconductor chip CPC, of the magnetically coupled coil L1$a$,L1$b$, the coil L1$b$ is the lower coil, the coil L1$a$ is the upper coil, and of the magnetically coupled coil L2$a$,L2$b$, the coil L2$b$ is the lower coil, and the coil L2$a$ is the upper coil. On the other hand, in the semiconductor chip CPC201 of the second examined example of FIG. 17, the coil L1$a$ of the coil L1$a$,L1$b$ is the lower coil, the coil L1$b$ is the upper coil, and the coil L2$a$ of the coil L2$a$,L2$b$ is the lower coil, and the coil L2$b$ is the upper coil.

In order to suppress the thickness of the interlayer insulating film between the lower coil of the semiconductor chip CPC and semiconductor substrate SB1, it is desirable to prevent a large potential difference from being generated between the lower coil of the semiconductor chip CPC and semiconductor substrate SB1. Even if the thickness of the interlayer insulating film between the lower coil of the semiconductor chip CPC and semiconductor substrate SB1 is reduced to some extent, the reliability of the semiconductor chip CPC and the semiconductor device PKG including the same is not reduced unless a large potential difference is generated between the lower coil of the semiconductor chip CPC.

Comparing the semiconductor chip CPC201 of the second examined example (FIG. 17) with the semiconductor chip CPC of the present embodiment (FIGS. 13 and 14), it is the semiconductor chip CPC201 of the second examined example (FIG. 17) that a large potential difference is likely to occur between the lower coil and semiconductor substrate SB1. This is because a higher potential (high voltage) may be supplied to the coil L1$b$ electrically connected to the semiconductor chip CPH via the wire BW and semiconductor substrate SB1 constituting the semiconductor chip CPC mounted on the die pad DPH via the bonding material BDC. The path from the power supply BT1 to the supply of the power supply potential (high voltage) V1 supplied to the circuit outside the semiconductor device PKG (for example, the inverter circuit shown in FIG. 1) to the coil L1$b$ includes, for example, a lead LD (specifically, a lead LD1), a wire BW for electrically connecting the lead LD and the semiconductor chip CPH to each other, a semiconductor chip CPH, and a wire BW for electrically connecting the semiconductor chip CPH and the semiconductor chip CPC to each other. Other routes include a lead LD (specifically, a lead LD1$a$, LD1$b$,LD1$c$), a die pad DPH connected to the lead LD, a wire BW that electrically connects the die pad DPH and the semiconductor chip CPH to each other and electrically connects the wire BW, the semiconductor chip CPH, and the semiconductor chip CPH and the semiconductor chip OOG to each other. On the other hand, as a path until the power supply potential (high voltage) V1 supplied from the power supply BT1 is supplied to semiconductor substrate SB1 constituting the semiconductor chip CPC, for example, there is a route that passes through the bonding material BDC interposed between the lead LD (specifically, the lead LD1$a$, LD1$b$,LD1$c$), the die pad DPH connected to the lead LD, and the semiconductor chip CPC and the die pad DPH. In the semiconductor chip CP201, a large potential difference is generated between the coil L1$b$ (upper coil) and the coil L1$a$ (lower coil), and a large potential difference is generated between the coil L1$a$ (lower coil) and semiconductor substrate SB1. Therefore, the interlayer insulating film between the lower coil and semiconductor substrate SB1 needs to be thickened in a semiconductor chip CP201 where a large potential difference is likely to occur between the lower coil and semiconductor substrate SB1.

On the other hand, in the present embodiment semiconductor chip CPC, the circuit in the semiconductor chip CPH and the wire BW are electrically connected to each other via the coil L1$b$,L2$b$ as a lower coil instead of an upper coil in the semiconductor chip CPC. Also in the present embodiment, since the semiconductor chip CPC and the semiconductor chip CPH are mounted on the die pad DPH, a higher potential may be supplied to each of the coil L1$b$ (lower coil) of the semiconductor chip CPC and semiconductor substrate SB1 constituting the semiconductor chip CPC. This generates a large potential difference between the coil L1$b$ (lower coil) and the coil L1$a$ (upper side coil) in the semiconductor chip CPC, but a large potential difference does not need to be generated between the coil L1$a$ (lower coil) and semiconductor substrate SB1. Therefore, when the semiconductor chip CPC201 of FIG. 17 is compared with the semiconductor chip CPC201 of FIG. 13, it is the semiconductor chip CPC201 of FIG. 17 that a large potential difference is highly likely to occur between the lower coil and semiconductor substrate SB1.

Therefore, the thickness of the interlayer insulating film between the lower coil and semiconductor substrate SB1 can be suppressed in the present embodiment semiconductor chip CPC in which a large potential difference is less likely to occur between the lower coil and semiconductor substrate SB1 (in this case, the coil L1$b$,L2$b$). Therefore, it is possible to sufficiently secure dielectric strength between the primary coil and the secondary coil formed in the semiconductor chip CPC while suppressing the thickness of the semiconductor chip CPC.

As described above, in the present embodiment, a transformer used for transmitting a signal between the semiconductor chip CPL and the semiconductor chip CPH is formed on the semiconductor chip CPC, and the semiconductor chip CPC is mounted not on the die pad DPL on which the semiconductor chip CPL is mounted but on the die pad DPH on which the semiconductor chip CPH is mounted. As a result, it is possible to suppress the thermal rise of CPH and to suppress the planar size (planar area) of the semiconductor device PKG. Therefore, it is possible to achieve both an improvement in reliability and a reduction in size of the semiconductor device PKG. In the semiconductor chip CPC, along with the semiconductor chip CPH mounted on the die pad DPH, a coil RX1 electrically connected to a circuit in the semiconductor chip CPH (here, a receiving circuit and a transmitting circuit TX2) is formed as a lower coil in the semiconductor chip RX1. A coil L1a,L2a electrically connected to a circuit (here, a transmitting circuit TX1 and a receiving circuit RX2) in the semiconductor chip CPL is formed as an upper coil in the semiconductor chip CPC. As a result, it is possible to suppress or prevent a large potential difference from occurring between the lower coil of the semiconductor chip CPC (in this case, the coil L1b,L2b) and semiconductor substrate SB1, and thus it is possible to improve the reliability of the semiconductor chip CPC and the semiconductor device PKG including the same. In the semiconductor chip CPC, the thickness of the semiconductor chip CPC can be suppressed because the thickness of the interlayer insulating film between the lower coil (in this case, the coil L1b,L2b) and semiconductor substrate SB1 can be suppressed. Consequently, the thickness of the semiconductor device PKG can be suppressed. Further, the semiconductor chip CPC can be easily manufactured because the thickness of the semiconductor substrate SB1 constituting the semiconductor chip CPC can be increased while suppressing the thickness of the semiconductor chip.

In the semiconductor device PKG101 according to the first examined example of FIGS. 15 and 16, the semiconductor chip CP101 is mounted on a die pad DPL101 on which the semiconductor chip CPL is mounted. For this reason, in the semiconductor device PKG101 according to the first examined example, it is preferable not to apply the semiconductor chip CPC (FIGS. 13 and 14) of the present embodiment, but to apply the semiconductor chip CP201 (FIG. 17) of the second examined example, as the semiconductor chip CP101. This is because, in the semiconductor device PKG101 (FIGS. 15 and 16) according to the first examined example, the potential to be supplied from the die pad DPL101 to the semiconductor substrate of the semiconductor chip CPC101 is the power supply potential (low voltage) V2 to be supplied from the power supply BT2 to the circuit (for example, the control circuit CC shown in FIG. 1) located outside of the semiconductor device PKG, rather than the power supply potential (high voltage) V1 to be supplied from the power supply BT1 to the circuit (for example, the inverter circuit shown in FIG. 1) located outside of the semiconductor device PKG. The power supply potential (low voltage) V2 may be supplied to the semiconductor substrate of the semiconductor chip CPC101 via a lead (specifically, a lead LD connected to the die pad DPL101) LD, a die pad DPL101 connected to the lead LD, and a bonding material BDC interposed between the semiconductor chip CPC and the die pad DPL101. For this reason, in the semiconductor device PKG101 of the first examined example (FIGS. 15 and 16), in order to prevent a large potential difference from occurring between the lower coil and the semiconductor substrate in the semiconductor chip CP101, the lower coil in the semiconductor chip CP101 is advantageously a coil L1a,L2a electrically connected to a circuit in the semiconductor chip CPL like the semiconductor chip CPC201 of FIG. 17. Therefore, the difference between the semiconductor device PKG101 of the first examined example (FIGS. 15 and 16) and the semiconductor device PKG of the present embodiment is that the semiconductor chip CPC is mounted not only by changing the die pad DPL to the die pad DPH, but also by reversing the top and bottom of the magnetically coupled coils in the semiconductor chip CPC in accordance with the modification of the die pad. This can be achieved by noticing that when two semiconductor chip CPC,CPH are mounted on the die pad DPH, a higher potential may be supplied to each of the coil CPC of the semiconductor chip L1b,L2b and each of semiconductor substrate SB1 constituting the semiconductor chip CPC.

When a high potential is supplied to the semiconductor chip CPH, the high potential is derived from the power supply potential V1 of FIG. 1. That is, since semiconductor device PKG lead LD1 is electrically connected to a circuit to which the power supply potential V1 is supplied (a circuit including the power transistor TS1,TS2), a high potential derived from the power supply potential V1 may be supplied to the semiconductor chip CPH from the lead LD1 through the wire BW (a wire BW electrically connecting the lead LD1 and the pad CPH of the semiconductor chip). Therefore, a transformer TR1,TR2 is interposed between the semiconductor chip CPH and the semiconductor chip CPL. Thus, even when a high potential derived from the power supply potential V1 is supplied to the semiconductor chip CPH, it is possible to prevent the high potential from being supplied to the semiconductor chip CPL. When a high potential derived from the power supply potential V1 is supplied to the semiconductor chip CPH, the high potential is supplied to the semiconductor chip CPH through a lead LD (specifically, a lead LD1a,LD1b,LD1c), a die pad DPH connected to the lead LD, and a wire BW electrically connecting the die pad DPH and the pad CPH of the semiconductor chip. Further, when a higher potential is supplied from the die pad DPH to CPC of the semiconductor chip to semiconductor substrate SB1, the path includes a bonding material BDC interposed between the semiconductor chip CPC and the die pad CPC. Therefore, when a conductive bonding material is used as the bonding material BDC, the present embodiment is extremely effective. When the present embodiment is electrically connected between the pad PH4 of the semiconductor chip CPH and the die pad DPH via the wire BW, the effectiveness thereof is extremely large.

Figure 19:
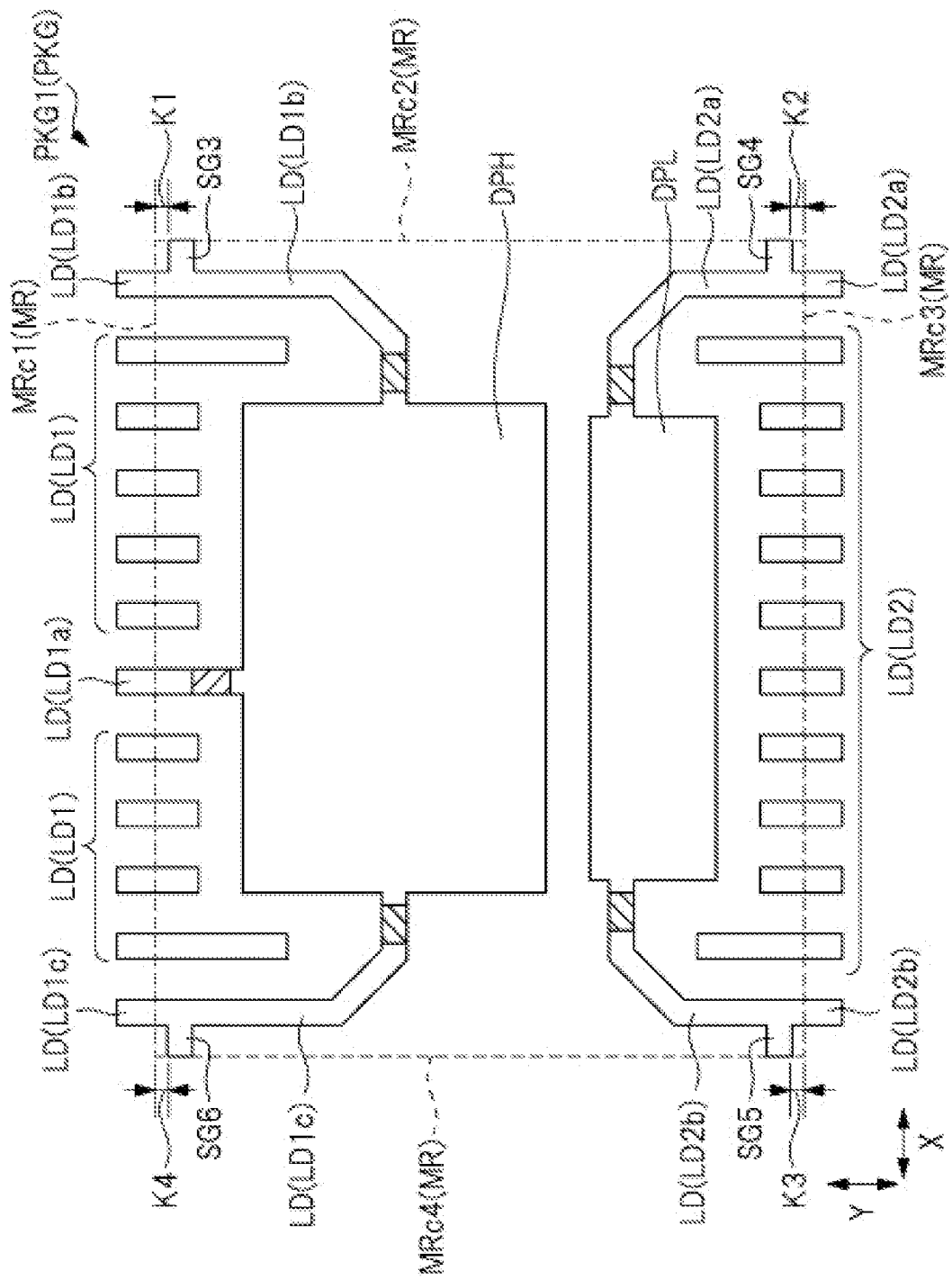
FIG. 19 is a perspective plan view of a semiconductor device according to the modified example.

In addition, in the present embodiment, a bent portion is provided in the inner lead portion of the lead LD1a,LD1b, LD1c,LD2a,LD2b so that the height position of the die pad DPH,DPL (upper surface DPHa,DPLa) is lower than the height position of the inner lead portion (upper surface) of the lead LD. In FIG. 5 and FIG. 19, which will be described later, the bent portion of the inner lead portion of the lead LD1a,LD1b,LD1c,LD2a,LD2b is hatched. The bent portion of the inner lead portion of the lead LD1a,LD1b,LD1c, LD2a,LD2b is provided prior to the die bonding step of the semiconductor chip CPC,CPH,CPL.

When the height position of the die pad DPH is lower than the height position of the inner lead wire of the lead LD in the cross-sectional view, it is possible to reduce the risk of the semiconductor chip CPH contacting the pad PH3 of the semiconductor chip CPH and the lead LD1 with upper surface end portion of the semiconductor chip BW. Further, in the cross-sectional view, by making the height position of the die pad DPL lower than the height position of the inner lead wire of the lead LD, it is possible to reduce the risk of the semiconductor chip CPL connecting the pad PL3 of the semiconductor chip CPL and the lead LD2 to upper surface end portion of the semiconductor chip BW. In addition, the thickness of the semiconductor chip CPC,CPH,CPL can be increased by providing a bent portion in the inner lead portion of the lead LD1a,LD1b,LD1c,LD2a,LD2b and decreasing the height of the die pad DPH,DPL. This makes it easier to manufacture the semiconductor chip CPC,CPH, CPL because the thickness of semiconductor substrate SB1, SB2,SB3 constituting the semiconductor chip CPC,CPH, CPL can be increased.

Modified Example

Figure 18:
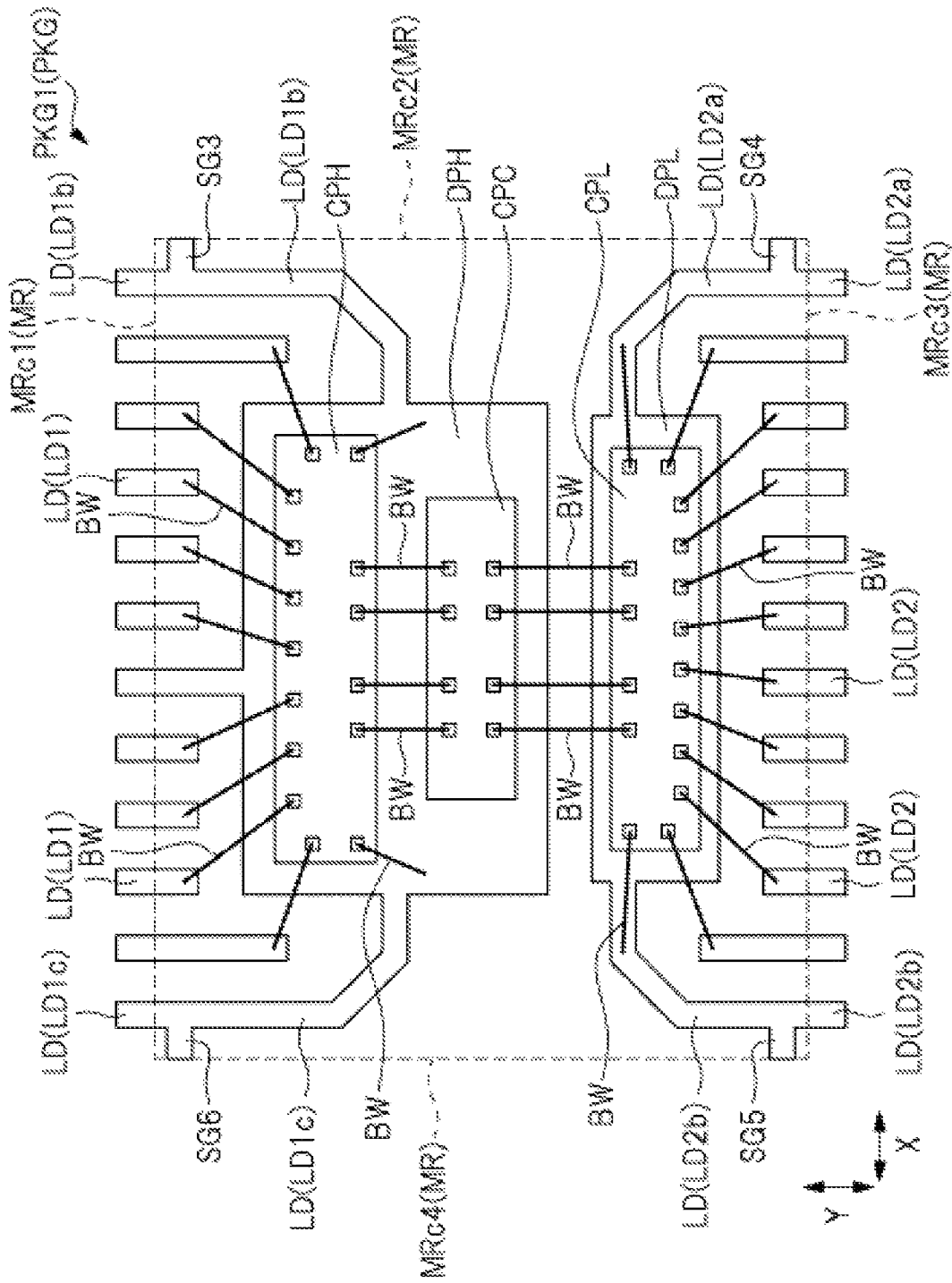
FIG. 18 is a perspective plan view of a semiconductor device according to a modified example.

FIG. 18 and FIG. 19 are a perspective plan view showing a modified example of the semiconductor device PKG according to the present embodiment, and respectively corresponds to FIGS. 3 and 5. Here, the semiconductor device PKG of the modified example shown in FIGS. 18 and 19 is referred to as the semiconductor device PKG1 with reference numeral PKG1. The semiconductor device PKG1 of the modified example is different from the semiconductor device PKG (FIGS. 2 to 7) described below.

The semiconductor device PKG of the modified example shown in FIGS. 18 and 19 does not have the support SG1,SG2 described above, but instead has a support SG3, SG4, SG5, SG6.

The support portion SG3 is connected to the side surface of the lead LD1$b$ (the side surface of the part extending in the Y direction), extends in the X direction, and reaches the side surface MRc2 of the sealing portion MR. The support portion SG3 hardly protrudes from the side surface of the sealing portion MR, and the front end surface of the support portion SG3 (the end surface opposite to the side connected to the lead LD1$b$) is exposed from the side surface MRc2 of the sealing portion MR.

The support portion SG4 is connected to the side surface of the lead LD2$a$ (the side surface of the part extending in the Y direction), extends in the X direction, and reaches the side surface MRc2 of the sealing portion MR. The support portion SG4 hardly protrudes from the side surface of the sealing portion MR, and the front end surface of the support portion SG4 (the end surface opposite to the side connected to the lead LD2$a$) is exposed from the side surface MRc2 of the sealing portion MR.

The support portion SG5 is connected to the side surface of the lead LD2$b$ (the side surface of the part extending in the Y direction), extends in the X direction, and reaches the side surface MRc4 of the sealing portion MR. The support portion SG5 hardly protrudes from the side surface of the sealing portion MR, and the front end surface of the support portion SG5 (the end surface opposite to the side connected to the lead LD2$b$) is exposed from the side surface MRc4 of the sealing portion MR.

The support portion SG6 is connected to the side surface of the lead LD1$c$ (the side surface of the part extending in the Y direction), extends in the X direction, and reaches the side surface MRc4 of the sealing portion MR. The support portion SG6 hardly protrudes from the side surface of the sealing portion MR, and the front end surface of the support portion SG6 (the end surface opposite to the side connected to the lead LD1$c$) is exposed from the side surface MRc4 of the sealing portion MR.

The die pad DPH and the lead LD1$a$ and lead LD1$b$ and the lead LD1$c$ and haptic SG3 and haptic SG6 are integrally formed. The die pad DPL, the lead LD2$a$, the lead LD2$b$, the support portion SG4, and the support portion SG5 are integrally formed.

In the side surface MRc2 of the sealing portion MR, the exposed portion of the sealing portion SG3 is located near the corner portion KD1 of the sealing portion MR. The distance (distance in the Y direction) from the exposed portion of the sealing portion MR on the side surface MRc2 of the sealing portion SG3 to the corner portion KD1 of the sealing portion K1 is preferably 1 mm or less.

In the side surface MRc2 of the sealing portion MR, the exposed portion of the sealing portion SG4 is located near the corner portion KD2 of the sealing portion MR. The distance (distance in the Y direction) from the exposed portion of the sealing portion MR on the side surface MRc2 of the sealing portion SG4 to the corner portion KD2 of the sealing portion K2 is preferably 1 mm or less.

In the side surface MRc4 of the sealing portion MR, the exposed portion of the sealing portion SG5 is located near the corner portion KD3 of the sealing portion MR. The distance (distance in the Y direction) from the exposed portion of the sealing portion MR on the side surface MRc4 of the sealing portion SG5 to the corner portion KD3 of the sealing portion K3 is preferably 1 mm or less.

In the side surface MRc4 of the sealing portion MR, the exposed portion of the sealing portion SG6 is located near the corner portion KD4 of the sealing portion MR. The distance (distance in the Y direction) from the exposed portion of the sealing portion MR on the side surface MRc4 of the sealing portion SG6 to the corner portion KD4 of the sealing portion K4 is preferably 1 mm or less.

Except for this, the semiconductor device PKG of modified example is substantially the same as that of the semiconductor device PKG of FIGS. 1 to 7, and therefore repetitive explanation thereof will be omitted here.

Figure 20:
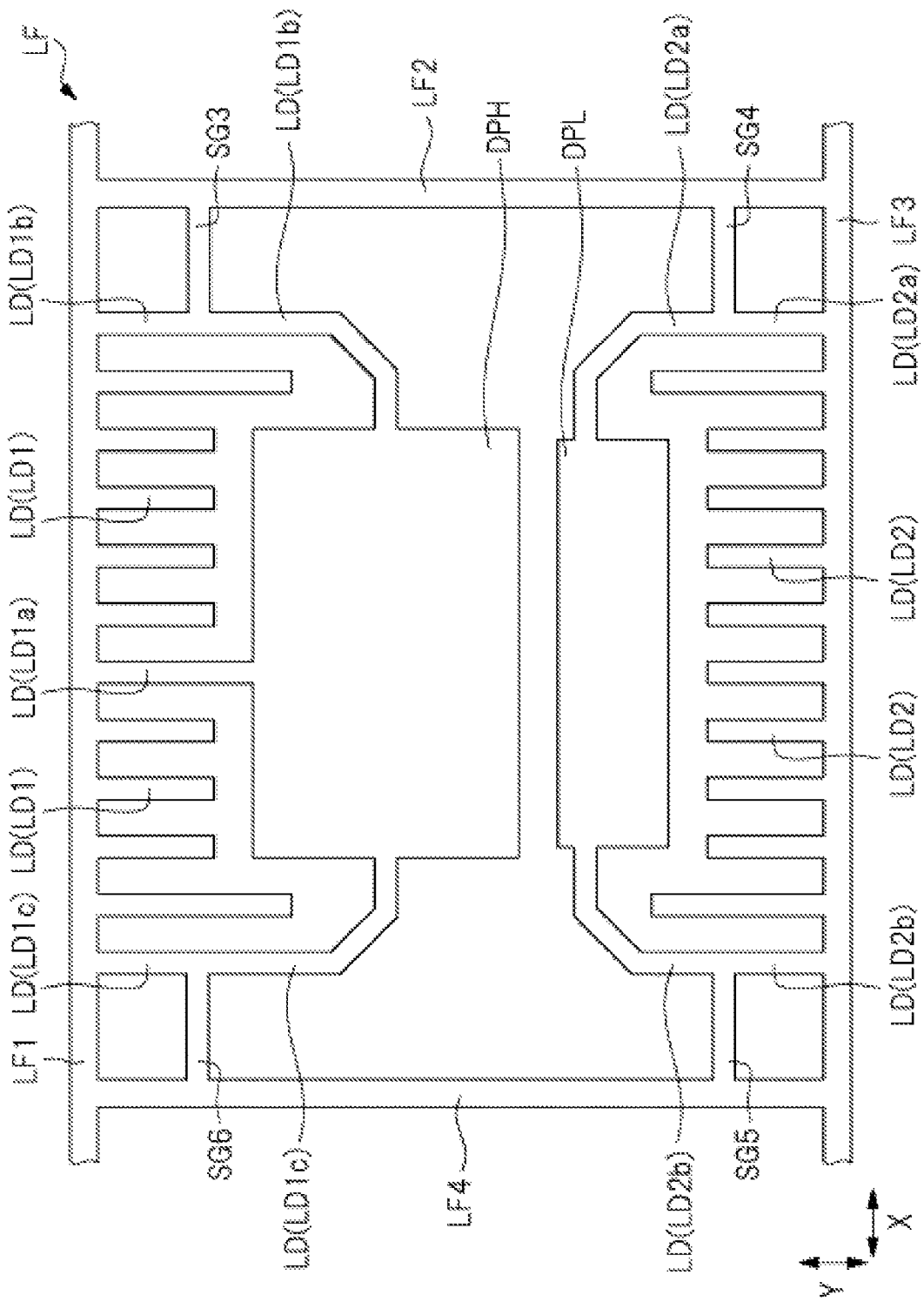
FIG. 20 is a plan view of a lead frame used to manufacture the semiconductor device according to the modified example.

Next, the manufacturing process of the semiconductor device PKG1 of modified example will be described. FIG. 20 is a plan view of a lead frame LF used to manufacture the semiconductor device PKG1 according to the modified example, and corresponds to FIG. 8.

First, the lead frame LF of FIG. 20 is different from the lead frame LF of FIG. 8. The lead frame LF shown in FIG. 20 is referred to as a lead frame LF of modified example.

The lead frame LF of the modified example shown in FIG. 20 does not have the support SG1,SG2 described above, but instead has a support SG3,SG4,SG5,SG6.

The support portion SG3 extends in the X direction, and one end portion is integrally connected to a side surface of the lead LD1$b$ (a side surface of a part extending in the Y direction), and the other end portion is integrally connected to the frame portion LF2. The support portion SG4 extends in the X direction, and one end portion is integrally connected to a side surface of the lead LD2$a$ (a side surface of a part extending in the Y direction), and the other end portion is integrally connected to the frame portion LF2. The support portion SG5 extends in the X direction, and one end portion is integrally connected to a side surface of the lead LD2$b$ (a side surface of a part extending in the Y direction), and the other end portion is integrally connected to the frame portion LF4. The support portion SG6 extends in the X direction, and one end portion is integrally connected to a side surface of the lead LD1$c$ (a side surface of a part extending in the Y direction), and the other end portion is integrally connected to the frame portion LF4.

Therefore, in modified example lead frame LF, the die pad DPH is connected to the frame portion SG6 via the lead LD1$a$,LD1$b$,LD1$c$ and the frame portion LF1, and is connected to the frame portion LF4 via the lead LD1$b$ and the support portion SG3 and is connected to the lead LD1$c$ and the support portion LF2. Therefore, the die pad DPH is supported on the frame portion LF1,LF2,LF4 by the lead LD1$a$,LD1$b$,LD1$c$ and the support portion SG3,SG6. Further, in modified example lead frame LF, the die pad DPL is connected to the frame portion LF via the lead LD2$a$,LD2$b$ and the frame portion LF3, and is connected to the frame portion LF via the lead LD2$a$ and the support portion SG4 and is connected to the frame portion LF2 via the lead LD2$b$ and the support portion SG4. Therefore, the die pad DPL is supported on the frame portion LF2,LF3,LF4 by the lead LD2$a$,LD2 and the support portion SG4,SG5.

Except for this, since modified example lead frame LF of FIG. 20 is substantially the same as that of the lead frame of FIG. 8, repeated explanation thereof will be omitted here.

The die bonding step and the wire bonding step are substantially the same as those in the case of manufacturing the semiconductor device PKG1 of modified example as in the case of manufacturing the semiconductor device PKG, and therefore, repeated explanation thereof will be omitted here.

Figure 21:
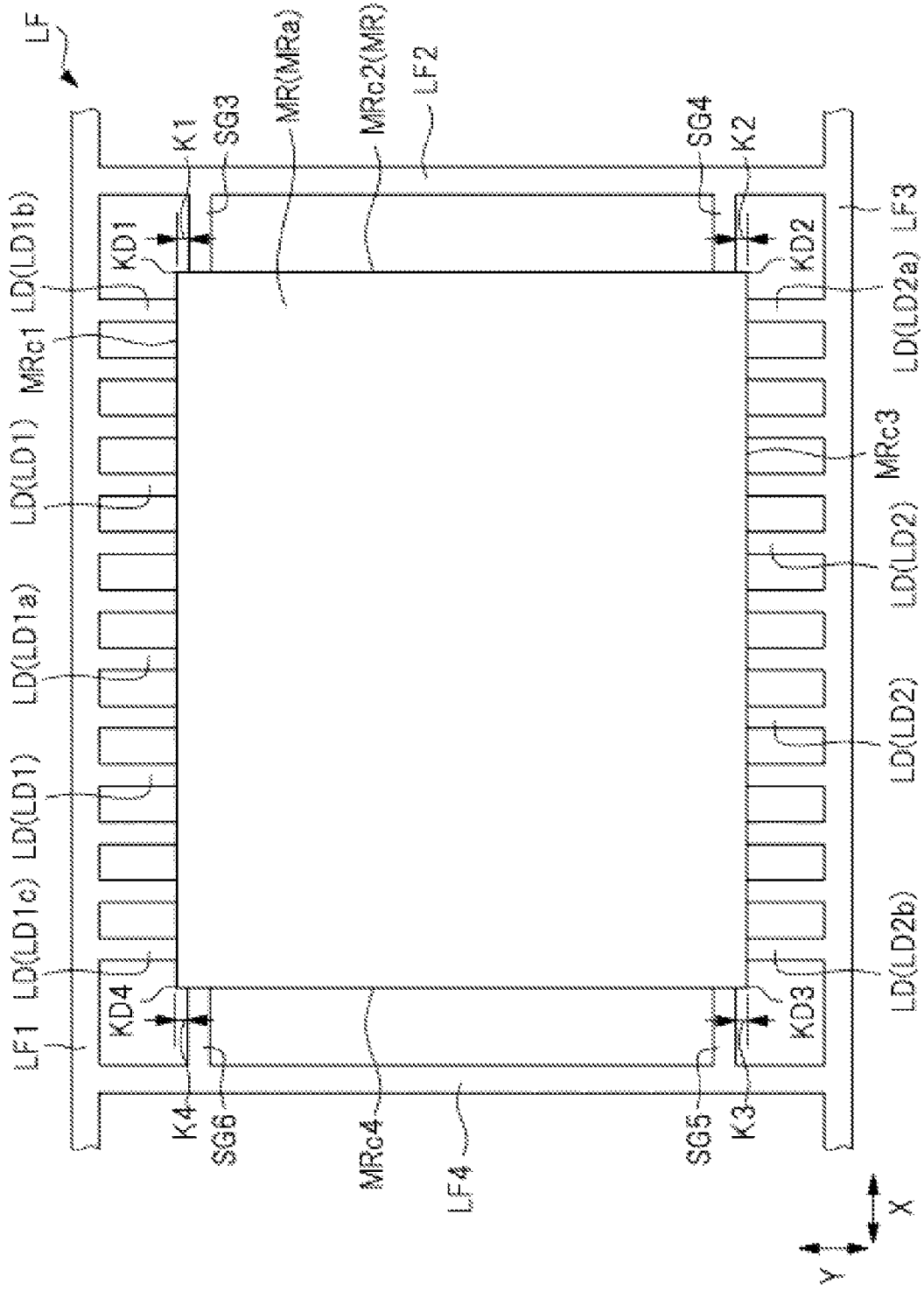
FIG. 21 is a plan view of the semiconductor device during a manufacturing process according to the modified example.

FIG. 21 is a plan view of the semiconductor device PKG1 during a manufacturing process according to the modified example, and shows a stage where the sealing portion MR is formed by performing the molding process.

By the molding process, a sealing portion MR for sealing the die pad DPH,DPL, the semiconductor chip CPC,CPH, CPL, the plurality of wire BW, and the inner lead portions of the plurality of lead LD is formed.

When the sealing portion MR is formed, a portion of each of the support portion SG3,SG4,SG5,SG6 is also sealed in the sealing portion MR. Specifically, the support portion SG3 integrally has a portion sealed in the sealing portion MR in the vicinity of the corner portion KD1 of the sealing portion MR, and a portion protruding out of the sealing portion MR from the side surface MRc2 of the sealing portion and connected to the frame portion LF2. The support portion SG4 integrally has a portion sealed in the sealing portion MR in the vicinity of the corner portion KD2 of the sealing portion MR, and a portion protruding out of the sealing portion MR from the side surface MRc2 of the sealing portion and connected to the frame portion LF2. The support portion SG5 integrally has a portion sealed in the sealing portion MR in the vicinity of the corner portion KD3 of the sealing portion MR, and a portion protruding out of the sealing portion MR from the side surface MRc4 of the sealing portion and connected to the frame portion LF4. The support portion SG6 integrally has a portion sealed in the sealing portion MR in the vicinity of the corner portion KD4 of the sealing portion MR, and a portion protruding out of the sealing portion MR from the side surface MRc4 of the sealing portion and connected to the frame portion LF4.

The sealing portion MR is supported by the side surface MRc1 side plurality of lead LD(LD1,LD1*a*,LD1*b*,LD1*c*) on the frame portion LF1, is supported by the side surface MRc3 plurality of lead LD(LD2,LD2*a*,LD2*b*) on the frame portion LF3, is supported on the frame portion LF4 by the side surface MRc2 support portion SG3,SG4, and is supported on the frame portion SG3,SG4 by the side surface MRc4 support portion SG5,SG6. That is, the sealing portion MR is stably supported on the frame portion LF1,LF2,LF3, LF4 by the plurality of lead LD and the support portion SG3,SG4,SG5,SG6.

After forming the sealing portion MR in the molding step, plating layers (not shown) are formed on the outer lead portions of the lead LD exposed from the sealing portion MR as needed. Then, outside the sealing portion MR, the lead LD is cut at a predetermined position and separated from the frame (the frame portion LF1, LF3) of the lead frame LF. At this time, after the cutting step of the plurality of lead LD(LD1,LD1*a*,LD1*b*,LD1*c*) on the side surface MRc1 side of the sealing portion MR and the cutting step of the plurality of lead LD(LD2,LD2*a*,LD2*b*) on the side surface MRc3 side of the sealing portion MR are performed in any order, the support portion SG3,SG4,SG5,SG6 of the part protruding from the sealing portion MR is cut. Accordingly, since the lead LD can be cut while the sealing portion MR is supported by the support portion SG3,SG4,SG5,SG6 on the frame portion LF2,LF4, the lead LD can be cut accurately.

Thereafter, in the same manner as in the manufacturing process of the semiconductor device PKG, the outer lead portion of the lead LD protruding from the sealing portion MR is bent (lead machining, lead forming), whereby the semiconductor device PKG1 of the modified example is manufactured.

When the semiconductor device PKG1 of modified example is manufactured, in the lead frame LF, the die pad DPH is supported not only on the frame portion LF1 by the lead LD1*a*,LD1*b*,LD1*c* but also on the frame portion LF2, LF4 by the lead LD1*b*,LD1*c* and the support portion SG3, SG6. Further, in the lead frame LF, the die pad DPL is supported not only by the lead LD2*a*,LD2*b* on the frame portion LF3 but also by the lead LD2*a*,LD2*b* and the support portion SG4,SG5 on the frame portion LF2,LF4. Therefore, since the die pad DPH,DPL can be stably supported by the frame of the lead frame LF, the die bonding process, the wire bonding process, and the molding process can be easily performed. In addition, since the step of cutting the lead LD can be performed while the sealing portion MR is supported by the support portion SG3,SG4,SG5,SG6 on the frame portion LF2, LF4, the lead LD can be accurately cut.

Further, in the semiconductor device PKG1 according to the modified example, the support portion SG3,SG4 is exposed from the sealing portion MR at the side surface MRc2 of the sealing portion MR, but, on the side surface MRc2 of the sealing portion MR, the exposed portion of the support portion SG3 is located in the vicinity the corner portion KD1 of the sealing portion MR, and the exposed portion of the support portion SG4 is located in the vicinity the corner portion KD2 of the sealing portion MR (see FIGS. 18, 19, and 21). Further, the support portion SG5,SG6 is exposed from the sealing portion MR at the side surface MR of the sealing portion MRc4, on the side surface MRc4 of the sealing portion MR, the exposed portion of the support portion SG5 is located in the vicinity of the corner portion KD3 of the sealing portion MR, and the exposed portion of the support portion SG6 is located in the vicinity of the corner portion KD4 of the sealing portion (see FIGS. 18, 19, 21). Accordingly, the creepage distance (distance along the surface of the sealing portion MR) between the exposed portion of the support portion SG3 from the sealing portion MR and the exposed portion of the support portion SG4 from the sealing portion MR can be increased, and the creepage distance between the exposed portion of the support portion SG5 from the sealing portion MR and the exposed portion of the support portion SG6 from the sealing portion MR can be increased. Therefore, the reliability of the semiconductor device PKG1 can be further improved.

However, in the side surface MR the sealing portion, it is more preferable that the side surface MRc1 of the sealing portion SG3,SG6 is not exposed, and in the side surface MRc3 of the sealing portion MR, it is more preferable that the support portion SG4,SG5 is not exposed. That is, the side surface of the support portion SG3,SG4,SG5,SG6 is preferably covered with the sealing portion MR. Accordingly, it is possible to more accurately suppress or prevent the occurrence of cracks in the sealing portion MR due to the support portion SG3,SG4,SG5,SG6.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:
a first chip mounting portion;
a second chip mounting portion;
a first semiconductor chip mounted on the first chip mounting portion;
a second semiconductor chip mounted on the second chip mounting portion;
a third semiconductor chip mounted on the second chip mounting portion, the third semiconductor chip including a first coil and a second coil; and
a sealing body sealing the first semiconductor chip, the second semiconductor chip, the third semiconductor chip, the first chip mounting portion and the second chip mounting portion,
wherein the first coil and the second coil are magnetically coupled to each other,
wherein the first coil is electrically connected with a first circuit formed in the first semiconductor chip,
wherein the second coil is electrically connected with a second circuit formed in the second semiconductor chip,
wherein, in cross-sectional view, the second coil is located closer to the second chip mounting portion than the first coil,
wherein a power consumption during an operation of the second semiconductor chip is greater than a power consumption during an operation of the first semiconductor chip, and
wherein an area of the second chip mounting portion is larger than an area of the first chip mounting portion.

2. The semiconductor device according to claim 1,
wherein the first circuit is one of a transmitting circuit and a receiving circuit, and
wherein the second circuit is another one of the transmitting circuit and the receiving circuit.

3. The semiconductor device according to claim 1, wherein a semiconductor element is not formed in the third semiconductor chip.

4. The semiconductor device according to claim 1,
wherein the first semiconductor chip is mounted on the first chip mounting portion via a first bonding material,
wherein the second semiconductor chip is mounted on the second chip mounting portion via a second bonding material, and
wherein the third semiconductor chip is mounted on the second chip mounting portion via a third bonding material.

5. The semiconductor device according to claim 4, wherein each of the first bonding material, the second bonding material and the third bonding material has a conductive characteristic.

6. The semiconductor device according to claim 1, further comprising:
a plurality of leads; and
a plurality of wires,
wherein the sealing body seals a portion of each of the plurality of leads, and the plurality of wires.

7. The semiconductor device according to claim 6,
wherein the first semiconductor chip has a plurality of first pads and a plurality of second pads,
wherein the second semiconductor chip has a plurality of third pads and a plurality of fourth pads,
wherein the third semiconductor chip has a plurality of fifth pads electrically connected with the first coil, and a plurality of sixth pads electrically connected with the second coil, and
wherein the plurality of wires includes:
a plurality of first wires electrically connecting the plurality of first pads of the first semiconductor chip with the plurality of fifth pads of the third semiconductor chip, respectively;
a plurality of second wires electrically connecting the plurality of third pads of the second semiconductor chip with the plurality of sixth pads of the third semiconductor chip, respectively;
a plurality of third wires electrically connecting the plurality of second pads of the first semiconductor chip with a plurality of first leads of the plurality of leads, respectively; and
a plurality of fourth wires electrically connecting the plurality of fourth pads of the second semiconductor chip with the plurality of second leads of the plurality of leads, respectively.

8. The semiconductor device according to claim 7,
wherein the second semiconductor chip further has a seventh pad, and
wherein the plurality of wires further includes:
a fifth wire electrically connecting the seventh pad of the second semiconductor chip with the first chip mounting portion.

9. The semiconductor device according to claim 7,
wherein the plurality of first leads is electrically connected with a third circuit located outside of the semiconductor device,
wherein the plurality of second leads is electrically connected with a fourth circuit located outside of the semiconductor device, and
wherein a power supply voltage to be supplied to the fourth circuit is higher than a power supply voltage to be supplied to the third circuit.

10. The semiconductor device according to claim 6, wherein, in cross-sectional view, a height position of each of the first chip mounting portion and the second chip mounting portion is lower than a height position of an inner lead portion of each of the plurality of leads.

11. A semiconductor device comprising:
a first chip mounting portion;
a second chip mounting portion;
a first semiconductor chip mounted on the first chip mounting portion;
a second semiconductor chip mounted on the second chip mounting portion;
a third semiconductor chip mounted on the second chip mounting portion, the third semiconductor chip including a first coil and a second coil; and
a sealing body sealing the first semiconductor chip, the second semiconductor chip, the third semiconductor chip, the first chip mounting portion and the second chip mounting portion,
wherein the first coil and the second coil are magnetically coupled to each other,
wherein the first coil is electrically connected with a first circuit formed in the first semiconductor chip,
wherein the second coil is electrically connected with a second circuit formed in the second semiconductor chip,
wherein, in cross-sectional view, the second coil is located closer to the second chip mounting portion than the first coil,
wherein the first semiconductor chip is electrically connected with a third circuit located outside of the semiconductor device, wherein the second semiconductor chip is electrically connected with a fourth circuit located outside of the semiconductor device, wherein a power supply voltage to be supplied to the fourth circuit is higher than a power supply voltage to be supplied to the third circuit, and wherein an area of the second chip mounting portion is larger than an area of the first chip mounting portion.

12. The semiconductor device according to claim 11, wherein a driving circuit electrically connected with each of the second circuit and the fourth circuit is formed in the second semiconductor chip, and wherein a power consumption during an operation of the second semiconductor chip is greater than a power consumption during an operation of the first semiconductor chip.

13. The semiconductor device according to claim 11, wherein a semiconductor element is not formed in the third semiconductor chip.

14. The semiconductor device according to claim 11, wherein the first semiconductor chip is mounted on the first chip mounting portion via a first bonding material, wherein the second semiconductor chip is mounted on the second chip mounting portion via a second bonding material, and wherein the third semiconductor chip is mounted on the second chip mounting portion via a third bonding material.

15. The semiconductor device according to claim 14, wherein each of the first bonding material, the second bonding material and the third bonding material has a conductive characteristic.

16. The semiconductor device according to claim 11, further comprising:

a plurality of leads; and
a plurality of wires, wherein the sealing body seals a portion of each of the plurality of leads, and the plurality of wires.

17. The semiconductor device according to claim 16, wherein the first semiconductor chip has a plurality of first pads and a plurality of second pads, wherein the second semiconductor chip has a plurality of third pads and a plurality of fourth pads, wherein the third semiconductor chip has a plurality of fifth pads electrically connected with the first coil, and a plurality of sixth pads electrically connected with the second coil, and wherein the plurality of wires includes:

a plurality of first wires electrically connecting the plurality of first pads of the first semiconductor chip with the plurality of fifth pads of the third semiconductor chip, respectively;

a plurality of second wires electrically connecting the plurality of third pads of the second semiconductor chip with the plurality of sixth pads of the third semiconductor chip, respectively;

a plurality of third wires electrically connecting the plurality of second pads of the first semiconductor chip with a plurality of first leads of the plurality of leads, respectively; and a plurality of fourth wires electrically connecting the plurality of fourth pads of the second semiconductor chip with the plurality of second leads of the plurality of leads, respectively.

18. The semiconductor device according to claim 17, wherein the second semiconductor chip further has a seventh pad, and wherein the plurality of wires further includes:

a fifth wire electrically connecting the seventh pad of the second semiconductor chip with the first chip mounting portion.

* * * * *